(12) United States Patent
Taylor et al.

(10) Patent No.: US 9,972,934 B1
(45) Date of Patent: May 15, 2018

(54) ELECTRONIC DEVICE WITH AN IRREGULAR PORT TO EXPEL LIQUID

(71) Applicant: Apple Inc., Cupertino, CA (US)

(72) Inventors: Warren Taylor, Felton, CA (US); Jesse A. Lippert, San Jose, CA (US); Amin M. Younes, Mountain View, CA (US); Paul Choiniere, Livermore, CA (US); Sathyanarayanan Kaliyamoorthy, Morgan Hill, CA (US); Maegan K. Spencer, La Honda, CA (US); Shannon X. Yang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/612,975

(22) Filed: Jun. 2, 2017

(51) Int. Cl.
| | |
|---|---|
| *H01R 13/52* | (2006.01) |
| *H01R 43/18* | (2006.01) |
| *H01R 25/00* | (2006.01) |
| *H05K 5/06* | (2006.01) |
| *H04B 1/3827* | (2015.01) |
| *A45C 11/00* | (2006.01) |

(52) U.S. Cl.
CPC ....... *H01R 13/5227* (2013.01); *H01R 25/006* (2013.01); *H01R 43/18* (2013.01); *H05K 5/069* (2013.01); *A45C 2011/002* (2013.01); *H04B 1/3833* (2013.01)

(58) Field of Classification Search
CPC .. H01R 43/18; H01R 25/006; H01R 13/5227; H01R 13/533; H01R 24/58; H01R 24/60; H01R 1/3833; H04N 1/18; H04M 1/0202; H05K 5/063; H05K 5/068; H05K 5/069; A45C 2011/002
USPC ................................ 439/206, 680, 374, 519
See application file for complete search history.

(56) References Cited

U.S. PATENT DOCUMENTS

| | | | | |
|---|---|---|---|---|
| 5,860,822 | A  * | 1/1999 | Nishide .............. | H01R 13/4361 439/206 |
| 8,002,564 | B2 * | 8/2011 | Cao ..................... | H01R 13/5227 439/205 |
| 8,431,819 | B2 * | 4/2013 | Pitkonen ............. | H04M 1/0202 174/50 |

\* cited by examiner

*Primary Examiner* — Renee S Luebke
*Assistant Examiner* — Paul Baillargeon
(74) *Attorney, Agent, or Firm* — Dickinson Wright RLLP

(57) ABSTRACT

An electronic device with a port is disclosed. To expel liquid in the port, the port includes modifications to form a capillary pressure gradient with the liquid, causing uneven capillary forces to act on the liquid in the port. For example, the port may include an asymmetric profile with one section having a curved profile and another section having one or more linear profiles that join at an edge. The edge may form a relative higher curved surface as compared to the curved profile. As a result, the capillary pressure gradient may exert a higher capillary pressure in a location associated with the edge, as compared to a capillary pressure along the curved profile. The capillary pressure gradient causes ambient air into the port along the edge, and separates the liquid from the edge, allowing gravity to overcome atmospheric pressure and causing removal of the liquid from the port.

20 Claims, 21 Drawing Sheets

ELECTRONIC DEVICE WITH AN IRREGULAR PORT TO EXPEL LIQUID

FIELD

The following description relates to a port in an electronic device. In particular, the following description relates to a port designed to cause a capillary pressure gradient. When a liquid becomes lodged in the port (and in contact with an internal surface of the port), the capillary pressure gradient may serve to drive the liquid out of the port. The port may include an asymmetric profile, or design, that is used to create the capillary pressure gradient. Further, at least some of the internal surface may be coated with a hydrophobic coating to lower the surface energy of the internal surface.

BACKGROUND

An electronic device can include a port that leads to an interior volume of the electronic device. The interior volume provides a housing for several internal components, such as an audio speaker. The port may allow acoustical energy (audio transmission) generated from the audio speaker to exit the electronic device. Alternatively, the electronic device may use the port as a vent.

However, due to the configuration of the port, the electronic device is vulnerable to water entering the port. Moreover, once the water enters the port, the water may become lodged in the port by attraction forces between the internal surface of the port and water molecules, and/or by ambient air providing a buoyancy force to the water. This can lead to one or more issues. For example, when the port is used as an opening for the audio speaker, the water may distort the audio transmission. When the port is used as a vent, the water may act as a barrier to air entering or exiting the electronic device.

SUMMARY

In one aspect, an electronic device is described. The electronic device may include an enclosure defining an internal volume. The enclosure may include a through hole. The electronic device may further include a port at least partially aligned with the through hole and extending at least to the internal volume. The port may include an internal surface. The internal surface may include a first portion having a first curvature that creates a first capillary pressure that is exerted by a liquid in contact with the first portion. The internal surface may further include a second portion having a second curvature that is different than the first curvature. The second curvature may create a second capillary pressure that is exerted by the liquid in contact with the second portion. The second capillary pressure may be different from the first capillary pressure.

In another aspect, a port suitable for use in an electronic device is described. The port may include a channel that defines an internal surface. The channel may include a first section that includes a first curvature that creates a first capillary pressure when a liquid is disposed along the internal surface in a location corresponding to the first section. The channel may further include a second section joined with the first section. The second section may include a second curvature that creates a second capillary pressure when the liquid is disposed along a location of the internal surface corresponding to the second section. The second curvature may be different from the first curvature. The channel may further include an asymmetric opening defined by the first curvature and the second curvature. In some embodiments, the first capillary pressure is different from the second capillary pressure based upon the asymmetric opening.

In another aspect, a method for forming a port suitable for use in an electronic device is described. The port may include an internal surface. The method may include forming a first section of a channel. The first section may include a first curvature that creates a first capillary pressure when a liquid disposed along the internal surface in a location corresponding to the first section. The method may further include forming a second section that is joined with the first section. The second section may include a second curvature that creates a second capillary pressure when the liquid is disposed along a location of the internal surface corresponding to the second section. The second curvature may be different from the first curvature. The method may include forming an asymmetric opening that is defined by the first curvature and the second curvature. In some embodiments, the first capillary pressure is different from the second capillary pressure based upon the asymmetric opening.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
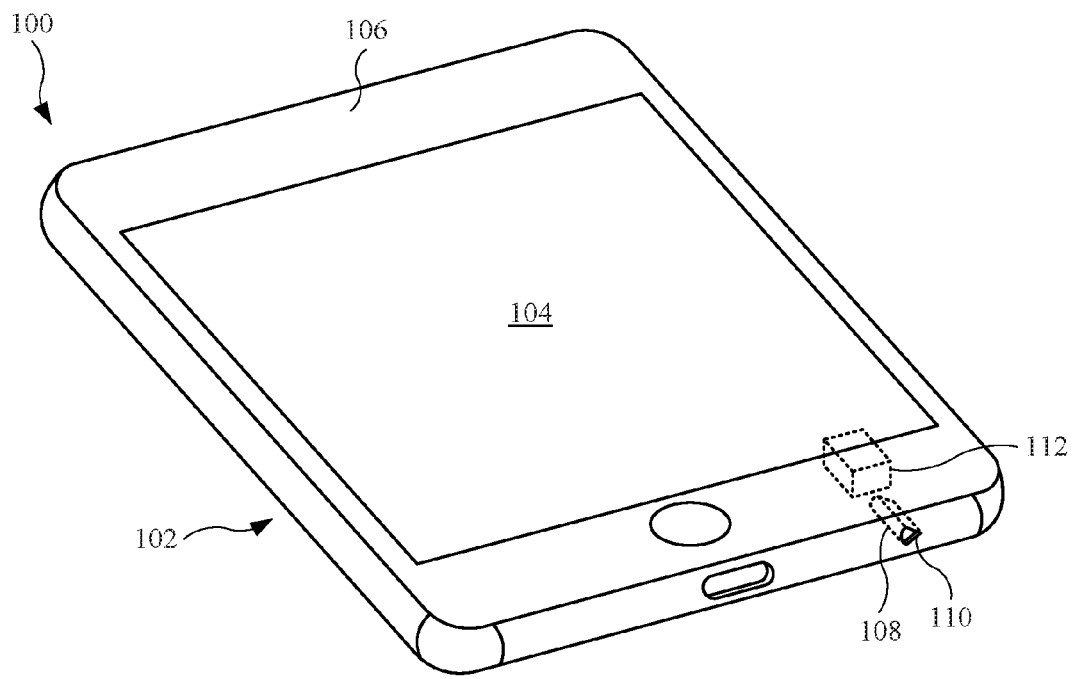
FIG. 1 illustrates an isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an electronic device that includes a port (or ports) that extends from an opening of an enclosure, or housing, of the electronic device to an internal volume of the electronic device defined by the enclosure. In some instances, when the electronic is exposed to liquid (such as water or some other aqueous-based solution), the liquid becomes lodged in the port. However, the port can include several modifications designed to expel or eject the liquid from the port, thereby removing the liquid from the electronic device.

In some instances, the port forms a channel that includes an irregular shape. The term "irregular" as used in this detailed description and in the claims refers to a profile (of the port) that includes an asymmetric profile, or asymmetric geometry. In other words, the port may include a cross sectional profile such that a line is drawn through the center of the cross sectional profile splits the port into two sections that are not exactly similar. As a result of the asymmetric profile, the port may include a radius, as measured from a center point of an opening formed by the asymmetric profile to an internal surface defined by a wall of the port, that varies based on the angle (relative to a reference angle) in which the radius drawn to the internal surface. In some embodiments, when the port includes an asymmetric profile, the port may include a first section that includes a rounded, or curved, wall, and a second section that includes two linear walls that connect with the rounded wall. The two linear walls also connect with each other to form an edge.

In the described embodiments herein, a port that includes an asymmetric profile is designed to expel or eject a liquid in contact with an internal surface of the port. In this regard, when the liquid is in the port, different capillary pressures are formed. This difference in capillary pressure may be referred to the Laplace pressure gradient. The capillary pressure (or capillary pressure difference across an interface between two static fluids), $p_c$, in a relatively narrow port (or tube) is governed by the Young-Laplace equation for capillary pressure in a tube, given by $$p_c = \frac{2\gamma\cos\theta}{r}$$

where $\gamma$ is the surface tension of the wall (internal surface of the port), $\theta$ is the contact angle between the liquid-air interface and the internal surface of the port, and r is the radius of the port. It can be deduced from the Young-Laplace equation that the capillary pressure, $p_c$, around the circumference of a port with an asymmetric profile will vary in accordance with the variance of the radius, r (assuming the contact angle, $\theta$, and the surface tension, $\gamma$, remain constant). Further, the capillary pressure, $p_c$, is inversely proportional to the radius, r, such that a reduced radius corresponds to an increase capillary pressure. When the liquid is in the port, a location (or locations) of relatively high capillary pressure, corresponding to a location in the port of relatively short radius, can have a greater impact on overcoming adhesion forces between the liquid and the internal surface (of the port), as compared to a location (or locations) of relatively low capillary pressure, which corresponds to a location in the port of relatively long radius. Accordingly, the location(s) of relatively high capillary pressure may initiate movement of the liquid in a direction away from the internal surface where the radius is relatively short, and ultimately expel the liquid from the port.

As a result of the capillary pressure gradient, a meniscus formed by the liquid in the port may form an asymmetric, or uneven, meniscus. Accordingly, the height of the liquid column (corresponding to a meniscus height), measured from the liquid-wall boundary to the "peak" of the liquid, also varies. The column height, h, at which the liquid rises (or falls, depending on the direction) in a relatively narrow port (or tube) is governed by the Young-Laplace equation for column height in a tube, given by $$h = \frac{2\gamma\cos\theta}{\rho g r}$$

where $\gamma$ is the surface tension of the wall (internal surface of the port), $\theta$ is the contact angle between the liquid-air interface and the internal surface of the port, $\rho$ is the fluid density of the liquid, g is the gravitational acceleration, and r is the radius of the port. Similar to the capillary pressure, the column height, h, of the meniscus will vary around the circumference of a port in accordance with a variation of the radius, r. Such a port with a varying radius may include a port with an asymmetric profile.

In the above-mentioned embodiment of a port having a rounded wall and two linear walls that meet at an edge, suppose the rounded wall forms a first curvature. The two linear walls may form a second, relatively higher curvature, as compared to the first curvature of the rounded wall, particularly in a location associated with the edge. As a result of the higher curvature along the edge, the radius of curvature defined by the location associated with the edge is less than that of the rounded wall, as the radius of curvature is inversely proportional to the curvature. Further, as the radius of curvature is proportional to the radius, it can be deduced from the Young-Laplace equation for capillary pressure that, when liquid is in the port, the capillary pressure along the edge is greater than the capillary pressure along the rounded wall. As a result, a capillary pressure gradient is formed within the port, which draws ambient air (external to the port) into the port, particularly in a location(s) associated with the edge. The ambient air entering the port may further separate the liquid from the internal surface along the edge of the port and initiate removal of the liquid from the port.

Also, it can further be deduced from the Young-Laplace equation for column height of a liquid in the port that the column height of the liquid along the edge is of a greater magnitude (i.e., taller) than that along the rounded wall. This suggests the liquid is further drawn away from the port along the edge as compared to the rounded wall. As ambient air continues to enter the port, the force provided by the ambient air continues to force the liquid away from the edge and (generally) toward the rounded wall, and also forces the liquid out of the port. In this regard, the port may be referred to as a "self-expelling port," as the port does not require external forces, such as load forces caused by, for example, human movement of the port or compressed air, to remove the liquid from the port.

In some instances, the port may include a symmetric profile and may include a coating applied to some locations of an internal surface of the port. For example, the port may include a cylindrical port (having a circular cross section) having with a coating partially applied to the internal surface. The coating is designed to alter the adhesion forces between liquid in the port and the internal surface of the port. The Young equation for surface tension between three phases—solid, liquid, and gas—is given by $$\gamma_{SG} = \gamma_{SL} + \gamma_{LG} \cos\theta$$

where $\gamma_{SG}$ is the surface tension between the solid (internal surface of the port) and the liquid (in gas/vapor form), $\gamma_{SL}$ is the surface tension between the solid (internal surface of the port) and the liquid (in liquid form), $\gamma_{LG}$ is the surface tension between the liquid (in liquid form) and the liquid (in gas/vapor form), and $\theta$ is the contact angle between the liquid-air interface and the internal surface of the port. Based on Young's equation, it can be deduced that the contact angle, $\theta$, is dependent upon the surface tension between the solid and the solid (internal surface of the port) and the liquid (in gas/vapor form), $\gamma_{SG}$, as well as the surface tension between the solid and the liquid (in liquid form), $\gamma_{SL}$. It should be apparent that as the internal surface (associated with the solid, S) changes, the surface tension between the solid, S, and the gas, G, changes, and the surface tension between the solid, S, and the liquid, L, changes. Accordingly, the contact angle, $\theta$, can vary in accordance with a variance in the internal surface.

In some instances, the coating may include a hydrophobic coating designed to reduce the adhesion forces between the liquid (in the port) and the internal surface in locations of the hydrophobic coating, thereby increasing the surface tension between liquid molecules such that the liquid molecules are more attracted to each other, as compared to molecules of the port at the internal surface. As a result, the liquid may include a higher propensity to separate from the internal surface along the hydrophobic coating, as compared to the internal surface in which no coating is present. Further, in accordance with Young's equation, the contact angle, θ, may increase in locations corresponding to the hydrophobic coating, as compared to the contact angle, θ, along the internal surface without any coating. This may cause a capillary pressure gradient (described above) within the port, which draws ambient air into the port along locations associated with the hydrophobic coating. The ambient air entering the port may further separate the liquid from the internal surface along the edge of the port and initiate removal of the liquid from the port.

It should be noted that the coating may include a hydrophilic coating. The hydrophilic coating is designed to increase the adhesion forces between the liquid (in the port) and the internal surface in locations of the hydrophilic coating, thereby decreasing the surface tension between liquid molecules such that the liquid molecules are more attracted to molecules of the port at the internal surface, as compared to other liquid molecules. This, too, may cause a variance in the contact angle, θ, resulting in a capillary pressure gradient within the port.

In some instances, the port may include both an asymmetric profile and a coating applied to the internal surface of the port. The coating may be applied to certain locations of the port, such the two linear walls associated with the edge (in the above example). In some instances, when the coating is applied to two or more locations, the port creates modulated adhesion forces with a liquid, when the liquid is present in the port, and combines with the modulated capillary pressures to expel the liquid. Alternatively, the coating may be applied to the internal surface of the port in its entirety and provide reduced adhesion forces with the liquid throughout the internal surface.

Also, other means for altering the surface tension may include texturing the internal surface of the port. For example, when the port is formed from a polymeric material, such as plastic, a molding operation may be used to form the port. The molding operation may use a mold cavity having a preformed pattern that creates several indentations or protrusions such that the internal surface forms a textured pattern corresponding to the indentations or protrusions, respectively. Also, in order to develop a surface tension gradient with a liquid along the internal surface, some, but not all, locations of the internal surface may be textured.

These and other embodiments are discussed below with reference to FIGS. 1-33. However, those skilled in the art will readily appreciate that the detailed description given herein with respect to these Figures is for explanatory purposes only and should not be construed as limiting.

FIG. 1 illustrates an isometric view of an embodiment of an electronic device 100, in accordance with some described embodiments. In some embodiments, the electronic device 100 includes a tablet computer device. In the embodiments shown in FIG. 1, the electronic device 100 includes a mobile communications device, such as a smartphone.

As shown, the electronic device 100 may include an enclosure 102, or housing. The enclosure 102 may be formed from a metal, such as aluminum, aluminum alloy, or ceramic, as non-limiting examples. The enclosure 102 may include a back wall and several sidewalls that combine to form an internal volume that houses several internal components (not shown), such as processor circuits, memory circuits, speaker modules, microphone, antennae, sensors (including a pressure sensor), etc.

Also, the electronic device 100 may further include a display assembly 104 designed to present visual information in the form of textual images and/or video images, as non-limiting examples. The display assembly 104 may include a touch sensor (not shown) designed to receive a touch input (from a user) in order to alter the visual information presented on the display assembly 104. Also, the electronic device 100 may further include a cover layer 106 that overlays the display assembly 104. The cover layer 106 may include a transparent material, such as glass, plastic, or sapphire.

Also, the electronic device 100 may further include a port 108 that extends from an opening 110, or through hole, of the enclosure 102 and into the internal volume (not shown) of the electronic device 100. The electronic device 100 may also include an internal component 112, which may include an audio module or a microphone, as non-limiting examples. The port 108 may serve one or more functions for the electronic device 100. For example, when the internal component 112 includes an audio module, the port 108 may allow acoustical energy (audible sound) generated from the internal component 112 to exit the electronic device 100. When the internal component 112 includes a microphone, the port 108 may allow the electronic device 100 to receive acoustical energy at the internal component 112. Still, in other embodiments, the electronic device 100 uses the port 108 as a vent to allow air to enter or exit the electronic device 100. This may allow the electronic device 100 to equilibrate its internal air pressure (located in the internal volume) with ambient air pressure. Also, it should be noted that the electronic device 100 may include multiple ports and openings similar to the port 108 and the opening 110, respectively, so that the electronic device 100 may include an audio module, a microphone, and a vent.

Figure 2:
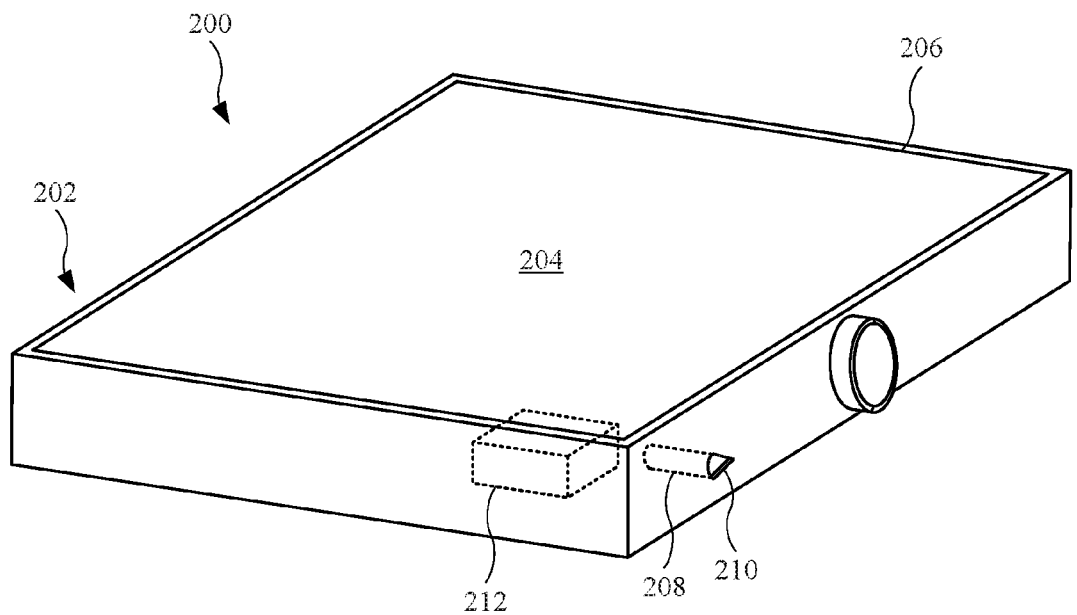
FIG. 2 illustrates an isometric view of an alternate embodiment of an electronic device, in accordance with some described embodiments.

FIG. 2 illustrates an isometric view of an alternate embodiment of an electronic device 200, in accordance with some described embodiments. In some embodiments, the electronic device 100 includes a wearable electronic device. In this regard, the electronic device 200 may include one or more bands (not shown) designed to secure the electronic device 200 with an appendage (such as a wrist) of a user. The electronic device 200 may include several features similar to that of the electronic device 100 (shown in FIG. 1). For example, the electronic device 200 may include an enclosure 202, or housing, formed from any material previously described for the enclosure 102 (shown in FIG. 1). The electronic device 200 may further include a display assembly 204 covered by a cover layer 206. The display assembly 204 and the cover layer 206 may include any feature or material previously described for a display assembly and a cover layer, respectively. Also, the electronic device 200 may further include a port 208 that extends from an opening 210 of the enclosure 202 to the internal volume (not shown) of the electronic device 200. The electronic device 200 may further include an internal component 212 that uses the port 208. The internal component 212 may include any internal component previously described in FIG. 1, and the port 208 may serve any function previously described for the port 108 (shown in FIG. 1).

In some embodiments, the port 108 (in FIG. 1) and the port 208 (in FIG. 2) include a generally circular shape having two sections symmetrical with one another. However, in the embodiments shown in FIGS. 1 and 2, the aforementioned ports include two sections that form an asymmetric profile. This will be further discussed below. In addition, the aforementioned ports in FIGS. 1 and 2 may be enlarged and exaggerated in size for purposes of illustrations.

Figure 3:
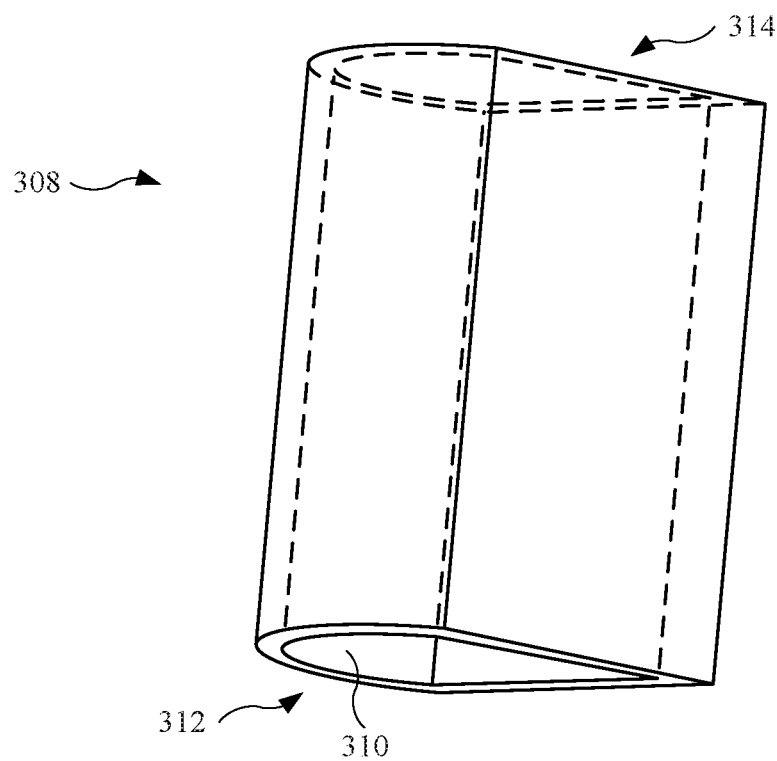
FIG. 3 illustrates an isometric view of an embodiment of a port suitable for use in an electronic device, in accordance with some described embodiments.

FIG. 3 illustrates an isometric view of an embodiment of a port 308 suitable for use in an electronic device (previously shown), in accordance with some described embodiments. The port 308 may include an internal surface 310. When the port 308 is positioned in an electronic device, liquid (not shown) from the external environment may contact the port 308 along one or more portions of the internal surface 310. However, the internal surface 310 may create different curvatures that can be used by the port 308 in order to eject or expel the liquid (not shown) in contact with the internal surface 310. This will be further discussed below.

The port 308 may further include a channel that includes a first opening 312 at a first end of the port 308, and a second opening 314 at a second end of the port 308 that is opposite the first end. Further, the port 308 may define a through hole that extends through the port 308 from the first opening 312 to the second opening 314. When positioned in an electronic device (not shown), the port 308 may align with an opening in an enclosure of an electronic device (such as the opening 110 shown in FIG. 1 or the opening 210 shown in FIG. 2). The port 308 may further extend to an internal volume and align with an internal component, thereby placing the internal component in communication with the ambient environment (external to the electronic device). In some embodiments, the port 308 is formed from a metal. In the embodiment shown in FIG. 3, the port 308 is formed from a molding operation. In this regard, injecting or extruding a moldable polymer into a mold cavity (not shown) can form the port 308, allowing the port 308 to embody a size and shape in accordance with the mold cavity.

Figure 4:
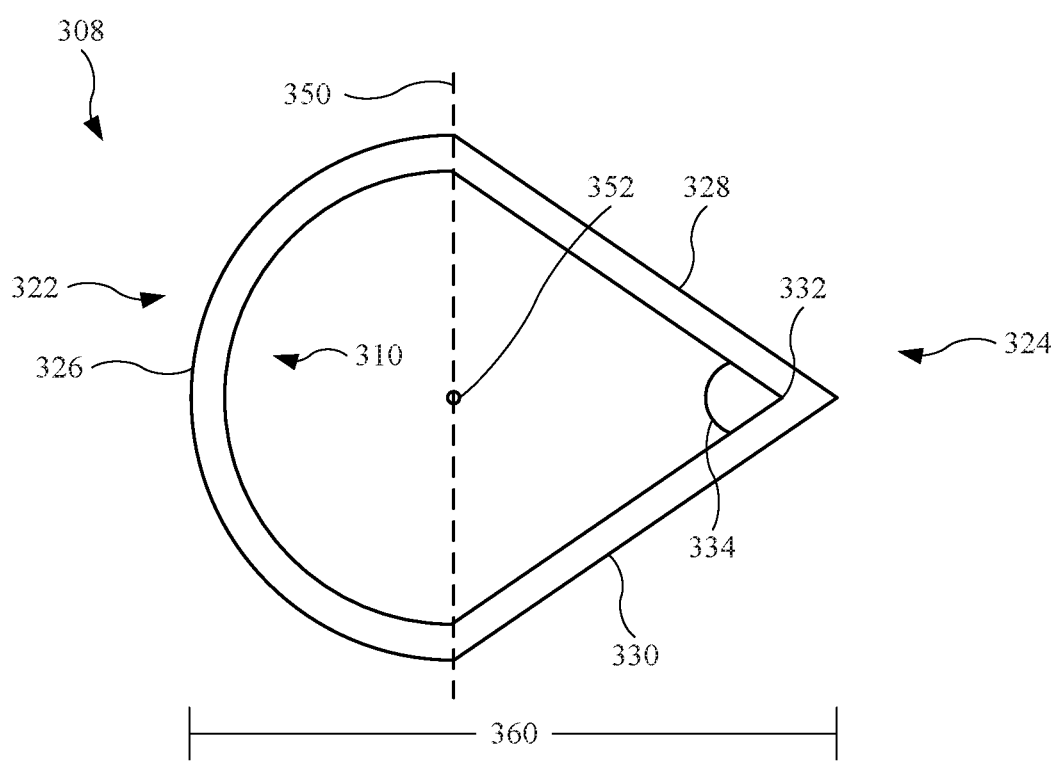
FIG. 4 illustrates a plan view of the port shown in FIG. 3, showing an asymmetric configuration of the port.

FIG. 4 illustrates a plan view of the port 308 shown in FIG. 3, showing an asymmetric profile of the port 308. The port 308 may include a first section 322 and a second section 324 connected with the first section 322. As shown, an imaginary centerline 350 drawn through a center point 352 of the port 308 separates the first section 322 from the second section 324. The first section 322 may be different from the second section 324. For example, the first section 322 may include a first wall 326 having a rounded or curved design, representative of a semicircle, a portion of an oblong shape, or the like. However, the second section 324 may include a second wall 328 and a third wall 330, both connected to the first wall 326, with the second wall 328 meeting the third wall 330 at an edge 332. The second wall 328 and the third wall 330 may be relatively straight (as compared to the first wall 326), and the second wall 328 and the third wall 330 may each be referred to as a linear wall. Accordingly, the port 308 may include a tubular port with an asymmetrical cross section, and the first opening 312 and the second opening 314 (both shown in FIG. 3) may both include an asymmetric opening. The edge 332 may form an angle 334 between the second wall 328 and the third wall 330. While the angle 334 is represented as a specific angle in FIG. 4, the angle 334 may vary in other embodiments. Generally, the angle 334 may be approximately in the range of 40 to 150 degrees. Also, the port 308 may include a dimension 360, measured at an outermost perimeter from the first wall 326 to the edge 332, representing a diameter of the port 308. The dimension 360 may be approximately in the range of 2 to 3 millimeters.

In traditional ports, liquid may become lodged or trapped inside the port, even when the liquid is aided by a gravitational force that would otherwise cause the liquid to exit, as the gravitational force may be offset by forces from ambient air and attractive forces between the liquid and the port.

However, the port 308 is designed to overcome forces that resist movement of the liquid. Based upon the different curvatures formed by the first wall 326, the second wall 328, and the third wall 330, the port 308 is designed to create different capillary pressures when a liquid (not shown) is in the port 308 to form a capillary pressure gradient. For example, the internal surface 310 along the first wall 326 may form a curvature that is different from a curvature formed by the internal surface 310 along the second wall 328 and the third wall 330 in location proximate to the edge 332. In this regard, the port 308 can use capillary pressure gradient to expel or eject the liquid that becomes lodged in the port 308 along the internal surface 310.

Figure 5:
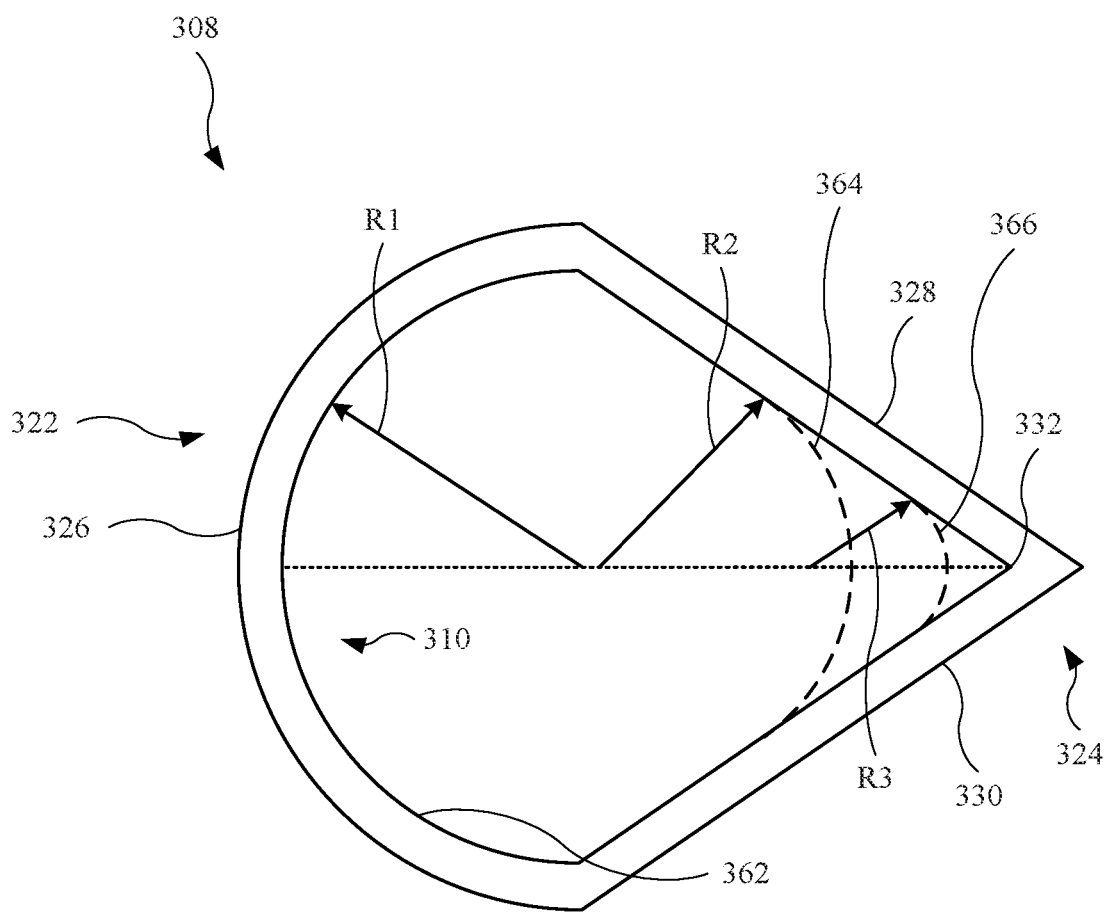
FIG. 5 illustrates a plan view of the port shown in FIG. 3, showing curvatures of the sections of the port.

FIG. 5 illustrates a plan view of the port 308 shown in FIG. 3, showing the curvatures of the sections of the port 308. As shown, the curvatures of the port 308 may vary. For example, the first section 322 (defined by the first wall 326) may define a first curvature 362 associated with a first radius of curvature, R1. Accordingly, the first curvature 362 is associated with the internal surface 310 along the first wall 326. When the first section 322 defines a semicircle, the first curvature 362, and in turn the first radius of curvature, R1, remains constant. However, when the first section 322 defines a dome or semi-ellipse, the curvature and the radius of curvature may vary.

The second section 324 (defined by the second wall 328 and the third wall 330) may define multiple differing curvatures. For example, along one location, the second section 324 defines a second curvature 364 (denoted by a dotted line) associated with a second radius of curvature, R2. The amount of curvature of the second curvature 364 may be higher as compared to that of the first curvature 362. In other words, the second curvature 364 is "more curved" than the first curvature 362. As a result, the second radius of curvature, R2, is less than (or smaller than) the first radius of curvature, R1. Furthermore, as the curvature of the second section 324 approaches the edge 332, the curvature increases. For example, the second section 324 may further define a third curvature 366 (denoted by a dotted line), associated with a third radius of curvature, R3. As shown, the third curvature 366 is closer to the edge 332 as compared to the second curvature 364. The amount of curvature of the third curvature 366 may be higher as compared to that of the second curvature 364. In other words, the third curvature 366 is "more curved" than the second curvature 364. As a result, the third radius of curvature, R3, is less than (or smaller than) the second radius of curvature, R2, and accordingly, the third radius of curvature, R3, is less than the first radius of curvature, R1. The variation in curvature along the port 308 may result in a capillary pressure gradient inside the port 308, which may assist in removing the liquid from the port 308. This will be shown and described below.

Figure 6:
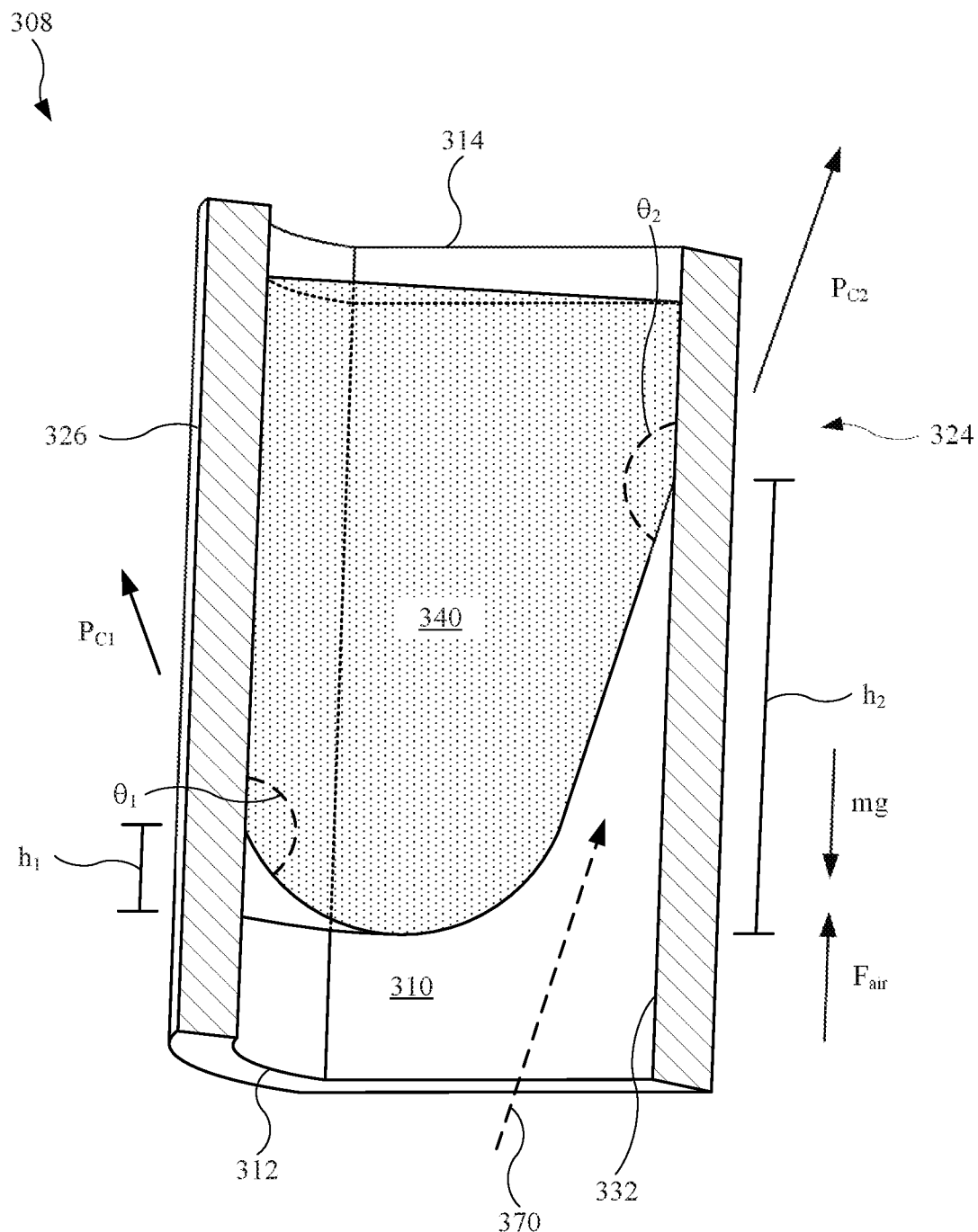
FIG. 6 illustrates a partial cross sectional view of the port shown in FIG. 3, taken along a longitudinal axis of the port, showing liquid inside the port.

FIG. 6 illustrates a partial cross sectional view of the port 308 shown in FIG. 3, taken along a longitudinal axis of the port 308, showing liquid 340 inside the port 308. The "longitudinal axis" of the port 308 refers to an axis parallel to a major length (that is, the greatest dimension) of the port 308 spanning end-to-end. When the port 308 is positioned in an electronic device (not shown), the first opening 312 may be aligned with an opening of an enclosure of the electronic device (such as the opening 110 shown in FIG. 1), while the second opening 314 may open to an internal volume of the electronic device, and may be in alignment with an internal component (such as the internal component 112 shown in FIG. 1) of the electronic device.

FIG. 6 further shows several forces acting on the liquid 340. For example, based on the orientation of the port 308, a gravitational force, mg, (where "m" is the mass of the liquid 340, and "g" is acceleration due to gravity) apply a force to the liquid 340 in a direction toward the first opening 312. However, the force provided by ambient air, $F_{air}$, may counter, or at least partially counter, the gravitational force, causing the liquid 340 to remain within the port 308. Also, attraction forces between the liquid 340 and the port 308 combine with the (buoyant) force of ambient air, $F_{air}$, to counter the gravitational force. Further, attraction forces between the internal surface 310 and molecules of the liquid 340 may also cause the liquid 340 to remain in the port 308. In this regard, the force of ambient air, $F_{air}$, and the attraction forces of the internal surface 310 and the liquid 340 may offset and counter the gravitational force, mg.

However, due in part to the aforementioned variations in curvature of the port 308, a capillary pressure gradient may form in the port 308, and may be used to overcome the retaining forces (described above) to expel or eject the liquid 340. As described above, within the port 308, a relatively low curvature (of the port 308) is formed along the first wall 326 may occur, while a relatively high curvature (as compared to the curvature along the first wall 326) is formed along the second wall 328 and the third wall 330 at or near the edge 332. This design of the port 308 creates different radii of curvature (as shown and described in FIG. 5), resulting in unbalanced capillary pressures. For example, as shown in FIG. 6, a first capillary pressure, $P_{C1}$, may form along the first wall 326. A second capillary pressure, $P_{C2}$, may form in a location generally opposite the first wall 326 along the edge 332 (and some surrounding areas of the internal surface located near the edge 332). As illustrated by the magnitude of the arrows, the second capillary pressure, $P_{C2}$, may be greater than the first capillary pressure, $p_{C1}$. This relationship may be derived by the Young-Laplace equation (shown above) for capillary pressure in a tube, as the radius of curvature (proportional to the radius) associated with the edge 332 is smaller than that of the first wall 326. As a result, ambient air 370 (or air external with respect to the port 308 and an electronic device that includes the port 308) may be drawn into the port 308 at the first opening 312, due to the second capillary pressure, $P_{C2}$, along a location associated with the edge 332. As the ambient air 370 extends through the port 308, the ambient air 370 may drive the liquid 340 away from the edge 332 and in a direction toward the first wall 326, as well as in a direction at least partially toward the first opening 312 such that the liquid 340 is expelled or ejected from the first opening 312.

Also, due in part to the capillary pressure gradient, a meniscus formed by the liquid 340 may include an asymmetric meniscus, as shown in FIG. 6. For example, the meniscus may form a first column height, $h_1$, along a location near the first wall 326, as well as a second, taller column height, $h_2$, along the edge 332. This relationship may be derived by the Young-Laplace equation (shown above) for column height in a tube, as the radius of curvature (proportional to the radius) of the edge 332 is smaller than that of the first wall 326. Further, the contact angles, $\theta_1$ and $\theta_2$, of the first column height, $h_1$ and the second column height, $h_2$, respectively, are each greater than 90 degrees, and accordingly, the column heights, $h_1$ and $h_2$, are "negative" and the meniscus of the liquid 340 is a convex meniscus.

Figure 7:
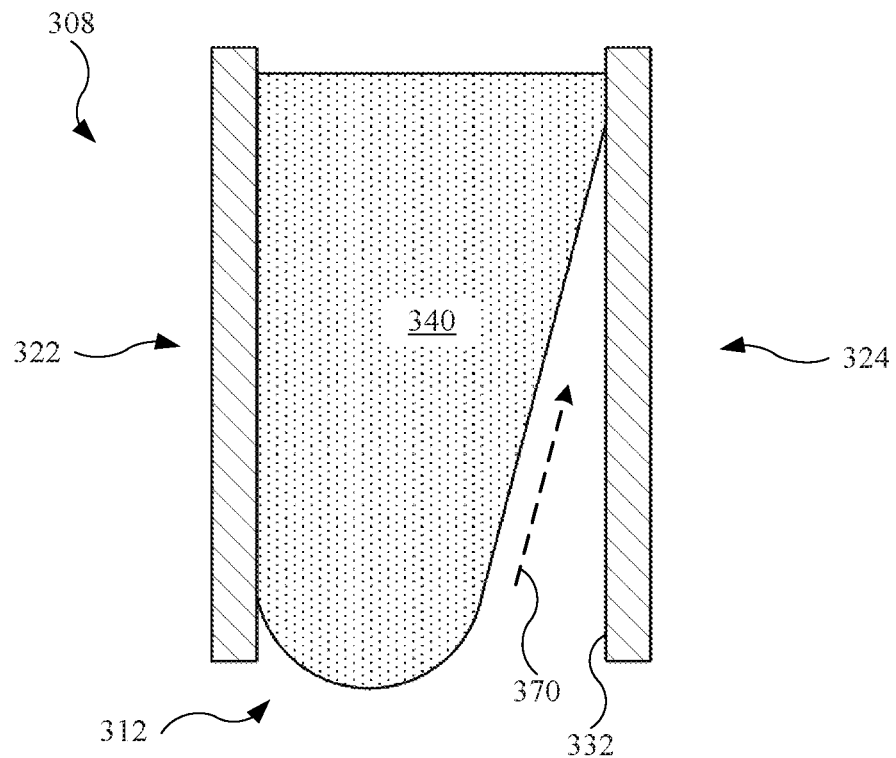
FIG. 7 illustrates a cross sectional view of the port shown in FIG. 6, showing the ambient air further entering the port causing the liquid to move away from the edge.

FIG. 7 illustrates a cross sectional view of the port 308 shown in FIG. 6, showing the ambient air 370 further entering the port 308 causing the liquid 340 to move further away from the edge 332. As the ambient air 370 continues to enter the port 308, the liquid 340 is further moving away from the second section 324 and toward the first section 322, and begins to exit the port 308 at the first opening 312.

Figure 8:
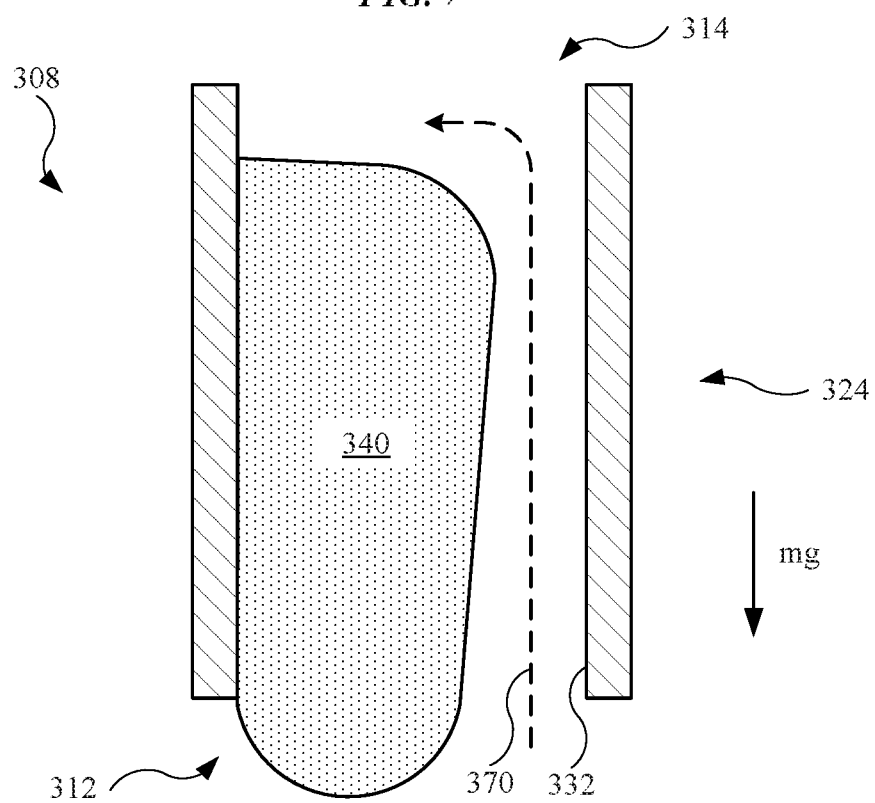
FIG. 8 illustrates a cross sectional view of the port shown in FIG. 9, showing the ambient air continuing to enter the port.

FIG. 8 illustrates a cross sectional view of the port 308 shown in FIG. 7, showing the ambient air 370 continuing to enter the port 308. As shown, the ambient air 370 forces the liquid 340 completely away from the edge 332 of the port 308. Also, as the liquid 340 is disengaged, or at least substantially disengaged, from the second section 324 of the port 308, the ambient air 370 is able extend to the second opening 314 (or near the second opening 314) and the gravitational force, mg, begins to overcome the force of air, $F_{air}$, that originally retained the liquid 340 in the port 308.

Figure 9:
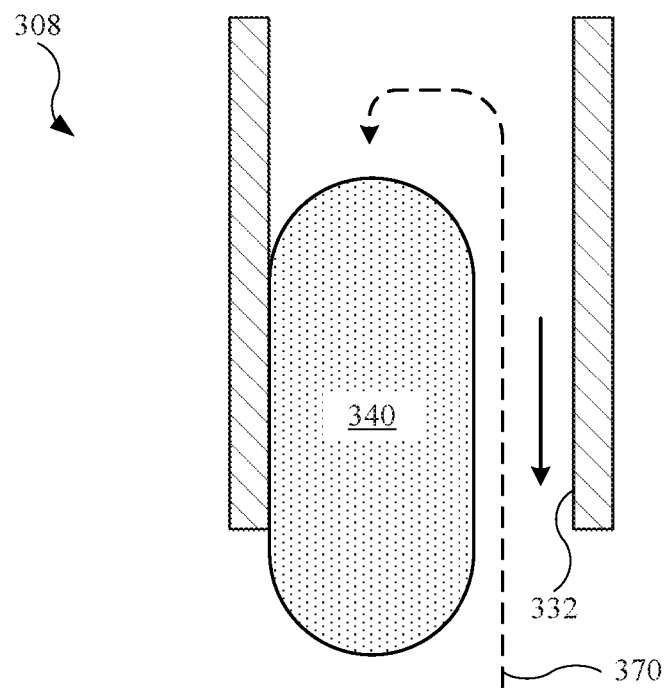
FIG. 9 illustrates a cross sectional view of the port shown in FIG. 8, further showing the liquid exiting the port.
Figure 10:
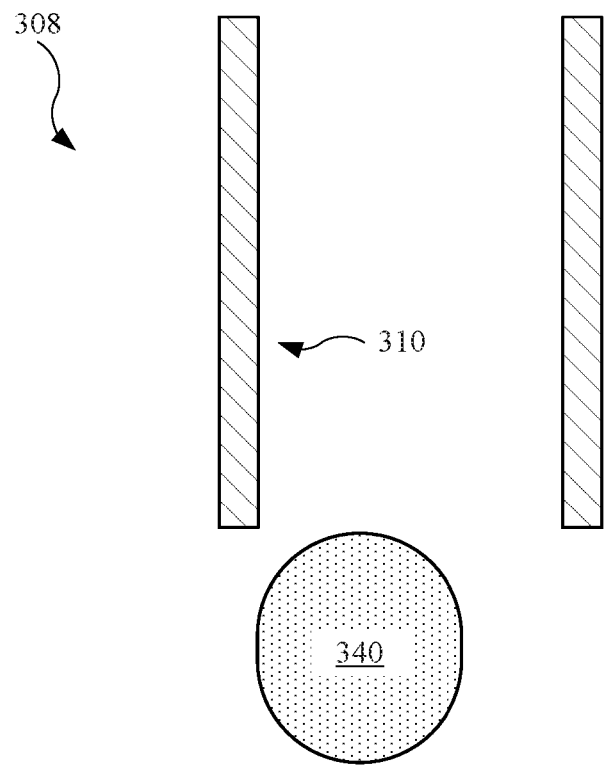
FIG. 10 illustrates a cross sectional view of the port shown in FIG. 9, showing the liquid fully exiting the port.

FIG. 9 illustrates a cross sectional view of the port 308 shown in FIG. 8, further showing the liquid 340 exiting the port 308. Due in part to additional ambient air entering the port 308, additional pressure is exerted on the liquid 340, providing an additional force that causes the liquid 340 to continue exiting the port 308. FIG. 10 illustrates a cross sectional view of the port 308 shown in FIG. 9, showing the liquid 340 fully exiting the port 308. As shown, the liquid 340 is no longer in contact with the internal surface 310 of the port 308. As a result of the capillary pressure gradient that occurs when the liquid 340 is in contact with various locations of the internal surface 310, the liquid 340 is forced out of the port 308. Accordingly, an electronic device (such as the electronic device 100 shown in FIG. 1, or the electronic device 200 shown in FIG. 2) that includes and uses the port 308 (or multiple ports similar to the port 308) in conjunction with an internal component (such as the internal component 112 shown in FIG. 1, or the internal component 212 shown in FIG. 2) can use the internal component(s) without interference from, or distortion caused by, the liquid 340.

Also, in addition to the force from air entering the port and overcoming adhesion forces between the liquid and the internal surface, other forces can combine with the force from air to eject the liquid. For example, when a user interacts with an electronic device (such as the electronic device 100 and the electronic device 200, shown in FIGS. 1 and 2, respectively), the user can agitate or otherwise move, purposely or incidentally, the electronic device in a direction toward the gravitational force, mg, (shown in FIG. 6), thereby exerting an additional force to the liquid and further facilitating liquid ejection from the port.

Figure 11:
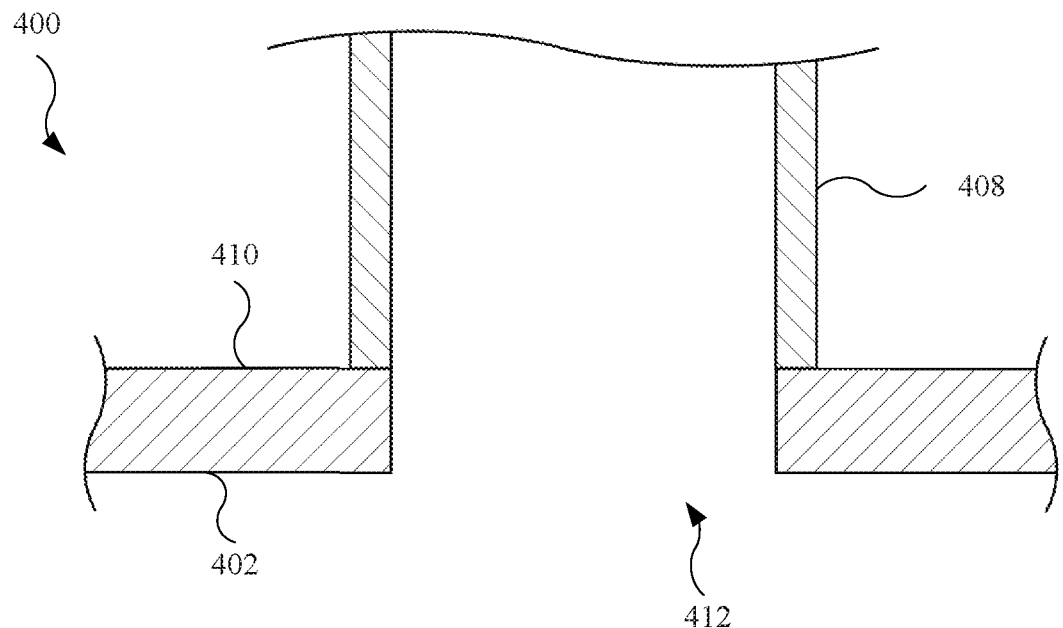
FIG. 11 illustrates a cross sectional view of a port positioned in an enclosure of an electronic device, showing the port positioned against the enclosure, in accordance with some described embodiments.
Figure 12:
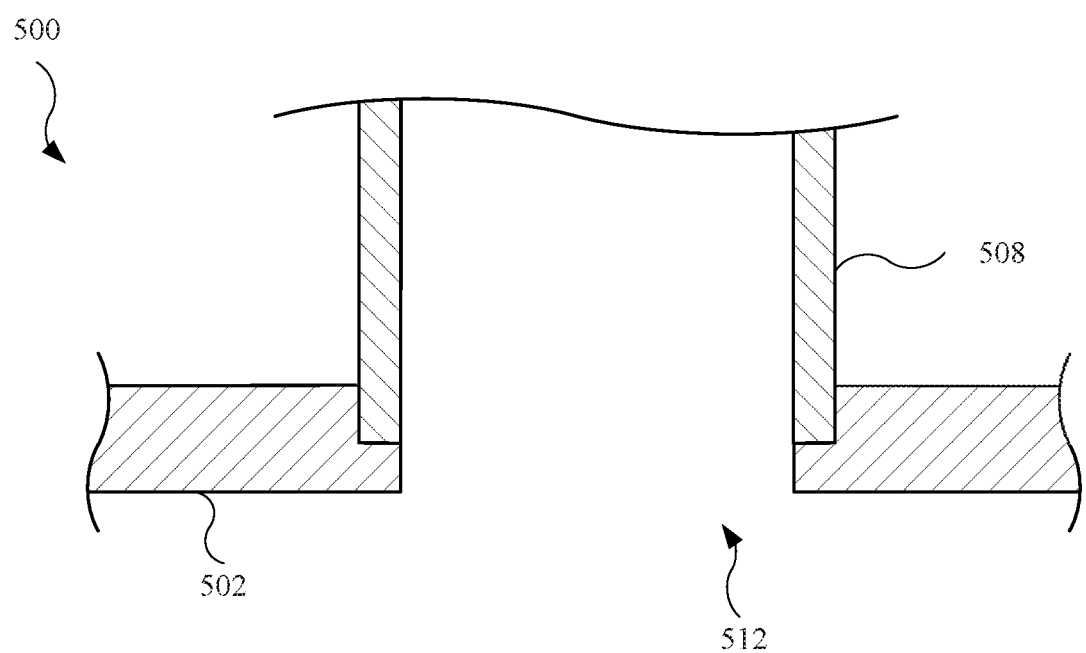
FIG. 12 illustrates a cross sectional view of a port positioned in an enclosure of an electronic device, showing the port partially positioned in an opening of the enclosure, in accordance with some described embodiments.
Figure 13:
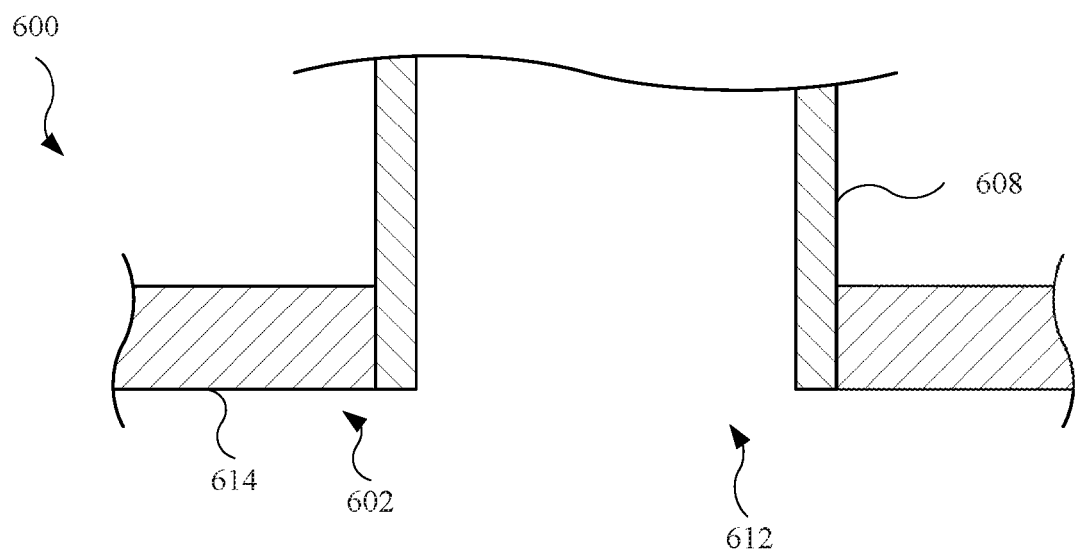
FIG. 13 illustrates a cross sectional view of a port positioned in an enclosure of an electronic device, showing the port extending through an opening of the enclosure to an exterior surface of the enclosure, in accordance with some described embodiments.

FIGS. 11-13 show various ways in which a port can be mounted with respect to an enclosure of an electronic device. The ports, enclosure, and electronic device may include any material(s) and/or feature(s) previously described for a port, an enclosure, and an electronic device, respectively. The methods illustrated for mounting the port can be used with several ports described herein.

FIG. 11 illustrates a cross sectional view of a port 408 positioned in an enclosure 402 of an electronic device 400, showing the port 408 positioned against the enclosure 402, in accordance with some described embodiments. As shown, the port 408 may be positioned in the electronic device 400 and abut an interior surface 410 of the enclosure 402. Moreover, the port 408 may be aligned with an opening 412, or through hole, of the enclosure 402. Although not shown, a liquid-resistant adhesive can be used to secure the port 408 to the enclosure 402.

FIG. 12 illustrates a cross sectional view of a port 508 positioned in an enclosure 502 of an electronic device 500, showing the port 508 partially positioned in an opening 512 of the enclosure 502, in accordance with some described embodiments. In order to partially position the port 508 within the opening 512, or through hole, a notch (not labeled) can be formed in the enclosure 502 in a location that surrounds the opening 512. In order to receive the port 508, the notch may include a size and shape corresponding to a size and shape of the port 508. The notch may provide assistance in assembling the port 508 with the enclosure 502.

FIG. 13 illustrates a cross sectional view of a port 608 positioned in an enclosure 602 of an electronic device 600, showing the port 608 extending through an opening 612 of the enclosure 602 to an exterior surface 614 of the enclosure 602, in accordance with some described embodiments. As shown, the opening 612, or through hole, may include a size and shape corresponding to a size and shape of the port 608. The port 608 may be co-planar, or flush, with respect to the exterior surface 614. This may ensure a more rigid fit between the port 608 and the enclosure 602.

Figure 14:
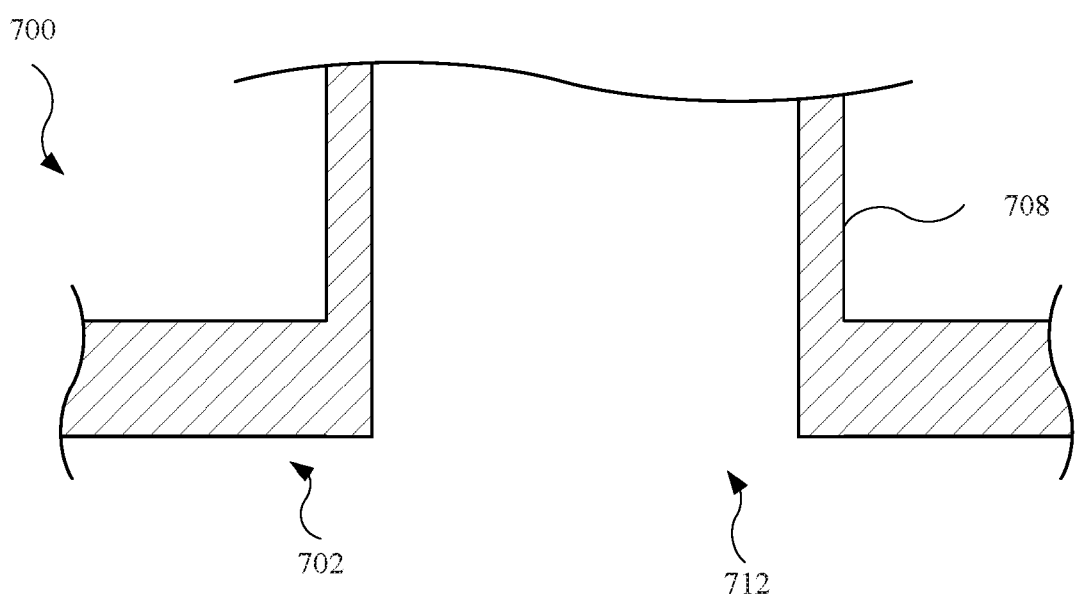
FIG. 14 illustrates a cross sectional view of an electronic device that includes an enclosure having a port that is integrally formed with the enclosure, in accordance with some described embodiments.

FIG. 14 illustrates a cross sectional view of an electronic device 700 that includes an enclosure 702 having a port 708 that is integrally formed with the enclosure 702, in accordance with some described embodiments. The enclosure 702 may include a size and shape similar to an enclosure previously described, such as the enclosure 102 (shown in FIG. 1) or the enclosure 202 (shown in FIG. 2). Also, the phrase "integrally formed" refers to two (or more) structural features that are formed from a single, continuous block of material. In this regard, in some embodiments, the enclosure 702 is formed from a block of metal, such as stainless steel or aluminum, that undergoes a machining operation(s) that cuts the block of metal to form not only the enclosure 702 but also the port 708 in a manner such that the port 708 extends into an internal volume defined by the enclosure 702. In other embodiments, the enclosure 702 is formed using a moldable material, such as a plastic or other polymeric material, that undergoes a molding operation, which may include compression molding or injection molding (as non-limiting examples). The molding operation not only forms the enclosure 102 but also the port 708 in a manner such that the port 708 extends into an internal volume defined by the enclosure 702. As shown, the port 708, being integrally formed with the enclosure 702, defines an opening 712, or through hole, that opens to an internal volume of the enclosure 702. Also, the port 708 may include a size and shape similar to the port 308 (shown in FIG. 6), and accordingly, may provide the same features and advantages described for the port 308 in FIG. 6.

Figure 15:
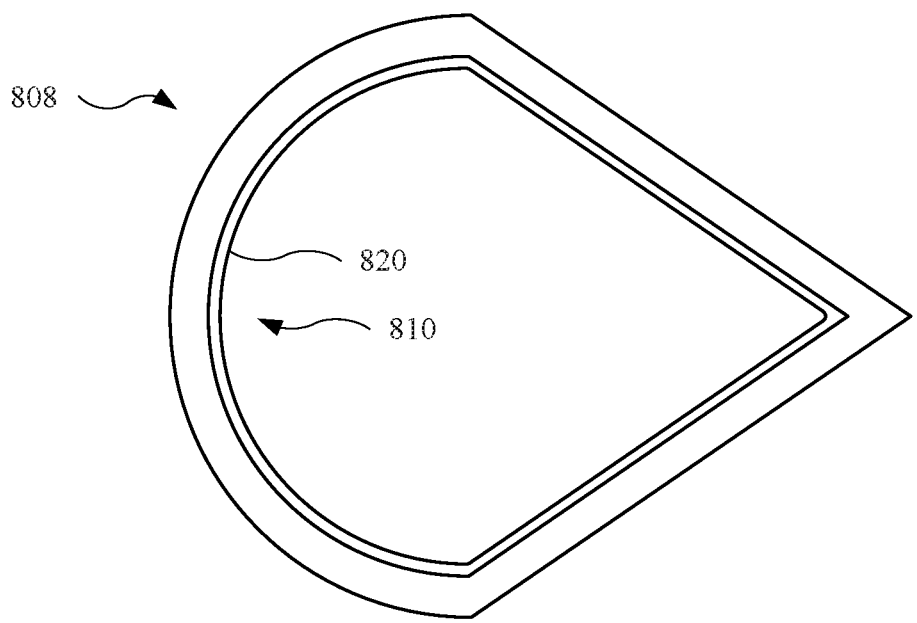
FIG. 15 illustrates a plan view an alternate embodiment of a port, showing the port having a coating applied to an internal surface of the port, in accordance with some described embodiments.
Figure 16:
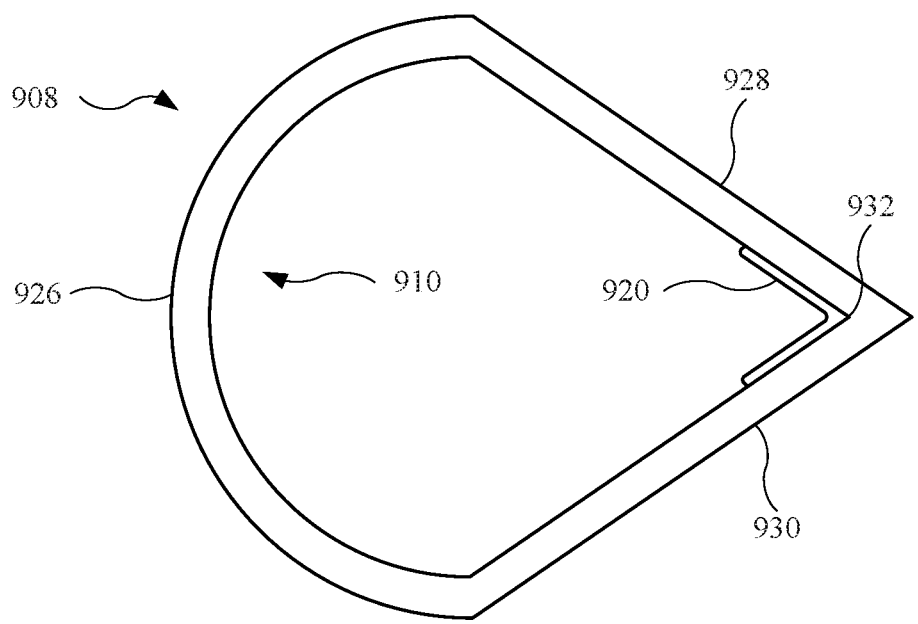
FIG. 16 illustrates a plan view an alternate embodiment of a port, showing the port having a coating partially applied to an internal surface of the port, in accordance with some described embodiments.

FIGS. 15 and 16 show further modifications that may be applied to a port described herein. For instance, an internal surface may include a coating designed to alter the surface energy of the internal surface. The coating may include a hydrophobic coating design to repel liquid disposed in the port. Accordingly, the hydrophobic properties may lower the surface energy of the port and reduce the adhesion forces between the internal surface and a liquid, thereby facilitating removal of the liquid from the port. Also, the ports shown in FIGS. 15 and 16 may include any feature(s) previously described for a port.

FIG. 15 illustrates a plan view an alternate embodiment of a port 808, showing the port 808 having a coating 820 applied to an internal surface 810 of the port 808, in accordance with some described embodiments. As shown, the coating 820 may be substantially applied to the internal surface 810, which may include its entirety or at least a majority of the internal surface 810. The coating 820 may reduce the surface energy of the internal surface 810 to assist in removing a liquid (not shown) from the port 808. Further, the coating 820 may compliment a capillary pressure gradient (previously described) formed when the liquid is in the port 808, in order to improve the removal of the liquid.

FIG. 16 illustrates a plan view an alternate embodiment of a port 908, showing the port 908 having a coating 920 partially applied to an internal surface 910 of the port 908, in accordance with some described embodiments. As shown, the coating 920 is applied to the internal surface 910 in a location associated with an edge 932 of the port 908. Also, as shown, port 908 includes a first wall 926 connected to a second wall 928 and a third wall 930. Similar to the embodiment shown and described in FIG. 4, the first wall 926 may define a first curvature, and a location along the second wall 928 and the third wall 930 near the edge 932 may form a second curvature having a curvature that is greater than that of the first curvature (i.e., "more curved"). In this regard, liquid (not shown) may undergo a capillary pressure gradient (in a manner previously described) with a relatively high capillary pressure formed along the edge 932. Moreover, due to the coating 920 along the edge 932, the surface energy of the internal surface 910 may be reduced at the edge 932, as compared to a location(s) of the internal surface 910 that does not include the coating 920.

Figure 17:
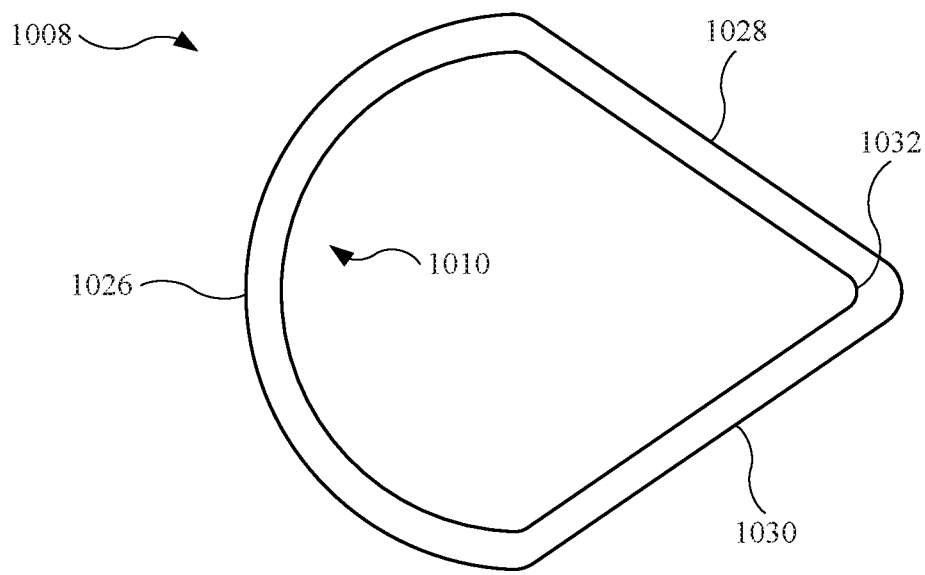
FIG. 17 illustrates a plan view an alternate embodiment of a port, showing the port having curved edges.

In addition to the asymmetric design of the port described above, some ports described herein may include different asymmetric designs. For example, FIG. 17 illustrates a plan view an alternate embodiment of a port 1008, showing the port 1008 having curved edges. As shown in FIG. 17, the port 1008 may include an internal surface 1010 defined by a first wall 1026, a second wall 1028, and a third wall 1030. The first wall 1026 may include a semi-circular, or substantially curved, design that connects to the second wall 1028 and the third wall 1030, with the second wall 1028 and the third wall 1030 having substantially linear designs. The connection between the first wall 1026 and the second wall 1028, as well as the connection between the first wall 1026 and the third wall 1030, may include a curved or rounded edge. Also, an edge 1032 formed by a connection between the second wall 1028 and the third wall 1030 may include a relatively curved or rounded edge, as compared to the edge 1032 of the port 308 shown in FIG. 3. When a liquid (not shown) is in the port 1008, the curved/rounded edges may alter the capillary pressure gradient, as compared to the capillary pressure gradient formed when the liquid 340 is in the port 308 shown in FIG. 6.

Figure 18:
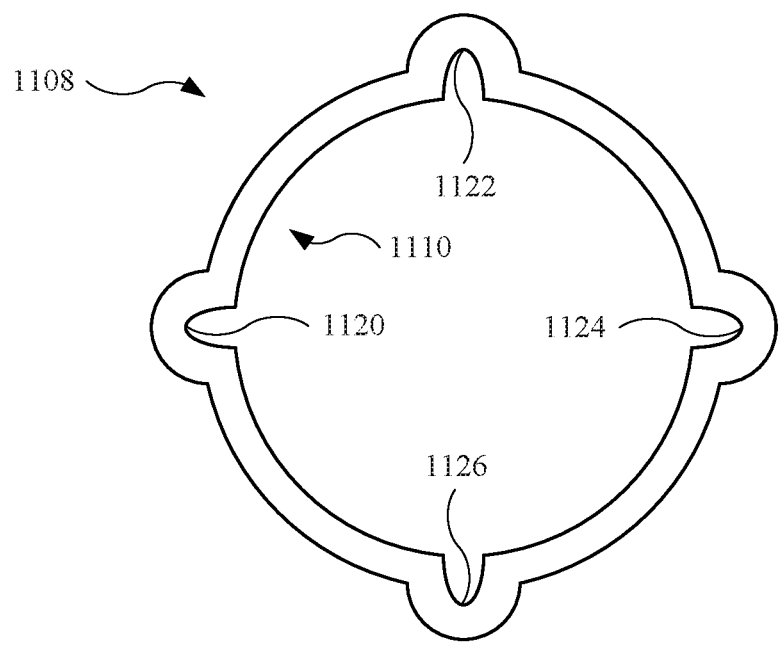
FIG. 18 illustrates a plan view an alternate embodiment of a port, showing the port having multiple notches.

FIG. 18 illustrates a plan view an alternate embodiment of a port 1108, showing the port 1008 having multiple notches. As shown, the port 1108 may include an internal surface 1110 defined in part by a first notch 1120, a second notch 1122, a third notch 1124, and a forth notch 1126. The substantial difference in curvature between the aforementioned notches (having a relatively high curvature) and curvature of the remaining portions of the internal surface 1110 (having a relatively low curvature) can lead to substantial differences in capillary pressures between a location associated with the notches and the remaining portions of the internal surface 1110, thereby providing a modulated capillary pressure in the port 1108. While a discrete number of notches are shown, the number of notches may vary in order to provide a desired modulated capillary pressure to the liquid in the port 1108.

Figure 19:
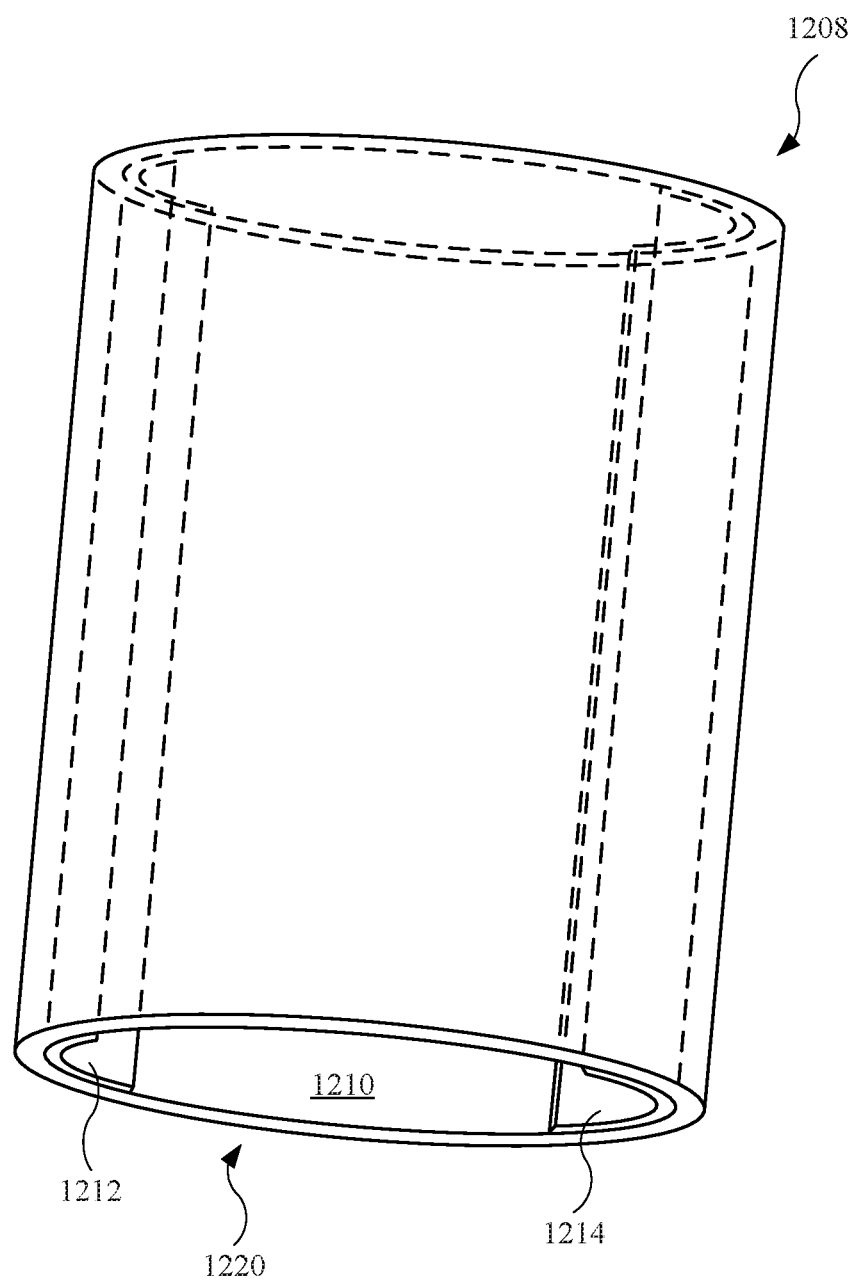
FIG. 19 illustrates an isometric view of an alternate embodiment of a port suitable for use in an electronic device, with the port having an internal surface that is partially coated, in accordance with some described embodiments.

In some instances, a port described herein may include a surface energy designed to expel water. For example, FIG. 19 illustrates an isometric view of an alternate embodiment of a port 1208 suitable for use in an electronic device, with the port 1208 having an internal surface 1210 that is partially coated, in accordance with some described embodiments. As shown, the port 1208 includes a channel having an opening 1220 that is circular, or substantially circular, in design. Accordingly, the port 1208 may include a cylindrical port with a circular cross section defined by the opening 1220. However, in some embodiment (not shown), the port 1208 includes a different rounded or curved designed, such as an ellipse or oblong design. Further, the port 1208 may include a through hole that extends through the port 1208 from the opening 1220 to a second opening (not labeled) that is opposite the opening 1220.

In order to vary the adhesion forces between a liquid (not shown) and the internal surface 1210 of the port 1208, the internal surface 1210 may include several coatings, such as a first coating 1212 and a second coating 1214. The first coating 1212 and the second coating 1214 may also be referred to as a first layer and a second layer, respectively. As shown in FIG. 19, the first coating 1212 and the second coating 1214 may be disposed end-to-end along the internal surface 1210 of the port 1208. As a result of the first coating 1212 and the second coating 1214, the internal surface 1210 may include coated regions (from the first coating 1212 and the second coating 1214) and uncoated region (regions of the internal surface 1210 with neither the first coating 1212 nor the second coating 1214). The first coating 1212 and the second coating 1214 may include a hydrophobic coating that reduces adhesion forces between a liquid and the internal surface 1210 (at a location along the first coating 1212 and the second coating 1214), as compared to the adhesion forces between the liquid and the uncoated regions. As a result, the internal surface 1210 includes a modulated adhesion force, with at least two coated regions of the internal surface 1210 designed to form relatively low adhesion forces with a liquid and at least two uncoated regions of the internal surface 1210 that form resultant relatively high adhesion forces. When a liquid is in the port 1208 against the internal surface 1210, the modulated adhesion force causes the liquid to separate from the internal surface 1210 along the coated regions, allowing air to enter into the port 1208 in locations along the coated regions, thereby initiating the liquid exiting the port 1208. This will be shown below. It should be noted that the adhesion forces formed by the uncoated regions are defined by the material used to form the port 1208, which may include a polymeric material, as a non-limiting example. In some embodiments (not shown), the first coating 1212 and the second coating 1214 include a hydrophilic coating that causes the coated regions to increase adhesion forces, as compared to the adhesion forces of the uncoated regions. Further, the coatings may vary in other embodiments. For example, in some embodiments, the first coating 1212 includes a hydrophobic material and the second coating 1214 includes a hydrophilic material. Also, in addition to having the first coating 1212 and the second coating 1214, in some embodiments (not shown), the port 1208 includes an asymmetric profile, similar to the design shown in FIG. 3.

Figure 20:
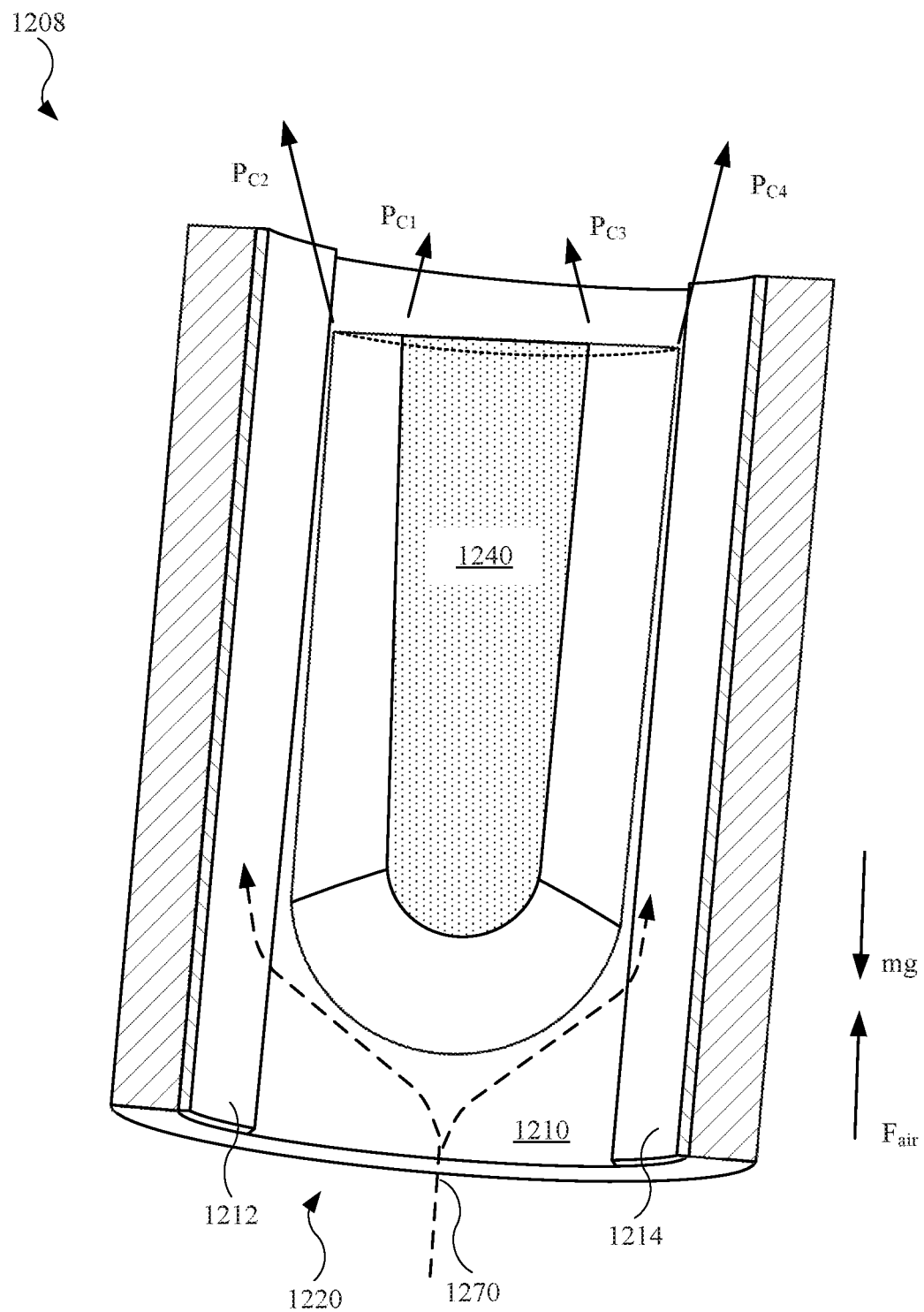
FIG. 20 illustrates a partial cross sectional view of the port shown in FIG. 19, taken along a longitudinal axis of the port, showing liquid inside the port.

FIG. 20 illustrates a partial cross sectional view of the port 1208 shown in FIG. 19, taken along a longitudinal axis of the port, showing a liquid 1240 inside the port 1208. As shown, several forces may act on the liquid 1240. For example, based on the orientation of the port 1208, a gravitational force, mg, apply a force to the liquid 1240 in a direction toward the opening 1220 (lower opening) of the port 1208. However, the force provided by ambient air, $F_{air}$, may counter, or at least partially counter, the gravitational force. Also, attraction forces between the liquid 1240 and along the uncoated regions of the internal surface 1210 combine with the ambient air force, $F_{air}$, to counter the gravitational force, mg, and retain the liquid 1240 within the port 1208.

However, due in part to the first coating 1212 and the second coating 1214 providing modulated adhesion forces, the port 1208 may expel or eject the liquid 1240 by overcoming the retaining forces (described above) such that the liquid 1240 is ejected from the port 1208. The first coating 1212 and the second coating 1214 create regions of relatively low adhesion forces with the liquid 1240, resulting in unbalanced capillary pressures to the liquid 1240 in multiple locations along the internal surface 1210. For example, with the first coating 1212 creating a lower adhesion force with the liquid 1240 (as compared to the uncoated region of the internal surface 1210), the surface tension of the molecules of the liquid 1240 is greater near the first coating 1212 as compared to the surface tension of the molecules of the liquid 1240 along the uncoated regions (between the first coating 1212 and the second coating 1214). As a result, the liquid 1240 has a propensity to separate from the internal surface 1210 in a location corresponding to the first coating 1212, creating a capillary pressure gradient. As shown in FIG. 20, the capillary pressure gradient includes a first capillary pressure, $P_{C1}$, along an uncoated region, and a second capillary pressure, $P_{C2}$, along the internal surface 1210 at the first coating 1212, with the second capillary pressure, $P_{C2}$, greater than first capillary pressure, $P_{C1}$. As a result of the capillary pressure gradient, ambient air 1270 (initially external with respect to the port 1208) enters the port 1208 at the opening 1220 along the first coating 1212, causing further separation between the liquid 1240 and the internal surface 1210 (along the first coating 1212).

Also, with the second coating 1214 creating a lower adhesion force (as compared to the uncoated region of the internal surface 1210), the surface tension of the molecules of the liquid 1240 is greater near the second coating 1214 as compared to the surface tension of the molecules of the liquid 1240 along the uncoated region. This causes a further propensity for the liquid 1240 to separate from the internal surface 1210 in a location corresponding to the second coating 1214. As shown in FIG. 20, the capillary pressure gradient may further include a third capillary pressure, $P_{C3}$, along the uncoated region, and a fourth capillary pressure, $P_{C4}$, along the internal surface 1210 at the second coating 1214, with the fourth capillary pressure, $P_{C4}$, greater than the third capillary pressure, $P_{C3}$. Also, the magnitude of the third capillary pressure, $P_{C3}$, and the fourth capillary pressure, $P_{C4}$, may be similar to that of the first capillary pressure, $P_{C1}$, and the second capillary pressure, $P_{C2}$, respectively. As a result of the capillary pressure gradient, ambient air 1270 (initially external with respect to the port 1208) enters the port 1208 at the opening 1220 along the second coating 1214, causing further separation between the liquid 1240 and the internal surface 1210 (along the second coating 1214). Although not shown, ambient air 1270 may continue to enter the port 1208 until the liquid 1240 is forced away from the first coating 1212 and the second coating 1214, and the gravitational force, mg, overcomes the force of air, $F_{air}$, such that the liquid 1240 is ejected from the port 1208 through the opening 1220.

Figure 21:
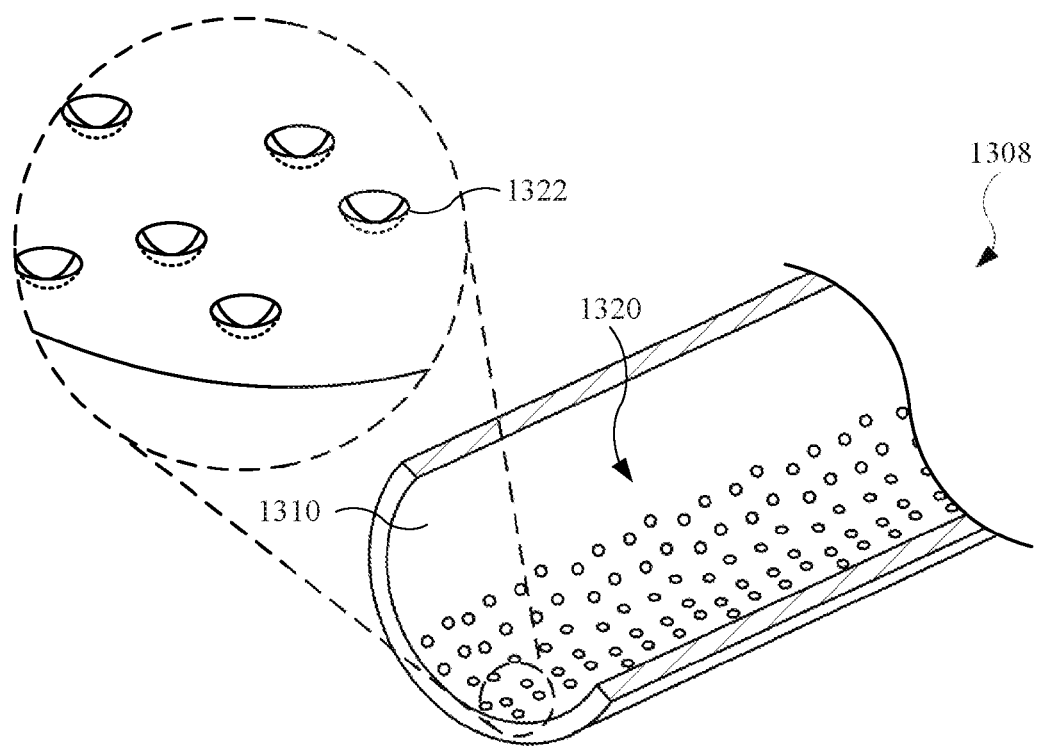
FIG. 21 illustrates a partial cross sectional view of an alternate embodiment of a port suitable for use in an electronic device, showing an internal surface of the port having several indentations, in accordance with some described embodiments.

In addition to having an asymmetric design and/or coatings, some ports described herein may include different modifications designed to vary adhesions forces with a liquid in contact with an internal surface of the port. For example, FIG. 21 illustrates partial cross sectional view of an alternate embodiment of a port 1308 suitable for use in an electronic device, showing an internal surface 1310 of the port 1308 having indentations 1320, in accordance with some described embodiments. The indentations 1320 may be located longitudinally along the port 1308. As shown in the enlarged view, an indentation 1322, representative of the indentations 1320, may be formed into a wall that defines the internal surface 1310. In order to form a gradient in adhesion force between a liquid (not shown) and the internal surface 1310 of the port 1308, some locations of the internal surface 1310 include the indentations 1320, while other locations of the internal surface 1310 remain relatively smooth. The textured surface, formed by the indentations 1320, causes a difference in adhesion force between a liquid and the internal surface 1310, as compared to the adhesion force of the relatively smooth locations of the internal surface 1310. In some instances, the adhesion force between the liquid and the internal surface 1310 along the indentations 1320 may be lower relative to the smooth locations of the internal surface 1310 that do not include the indentations 1320. However, this may differ based on the liquid and the type of material that forms the port 1308. Also, a molding operation can be used to form the port 1308, in which a moldable material is extruded into a mold cavity (not shown), by an injection molding or compression molding operation. The moldable material can cure in the aforementioned mold cavity to form the port 1308. Also, the mold cavity may include smooth regions and protruding regions, with the protruding regions having a shape corresponding to the indentations 1320. Although the indentations 1320 are shown in a single location of the internal surface 1310, the internal surface 1310 may include an additional location (or locations) having an indentation pattern similar to that of the indentations 1320.

Figure 22:
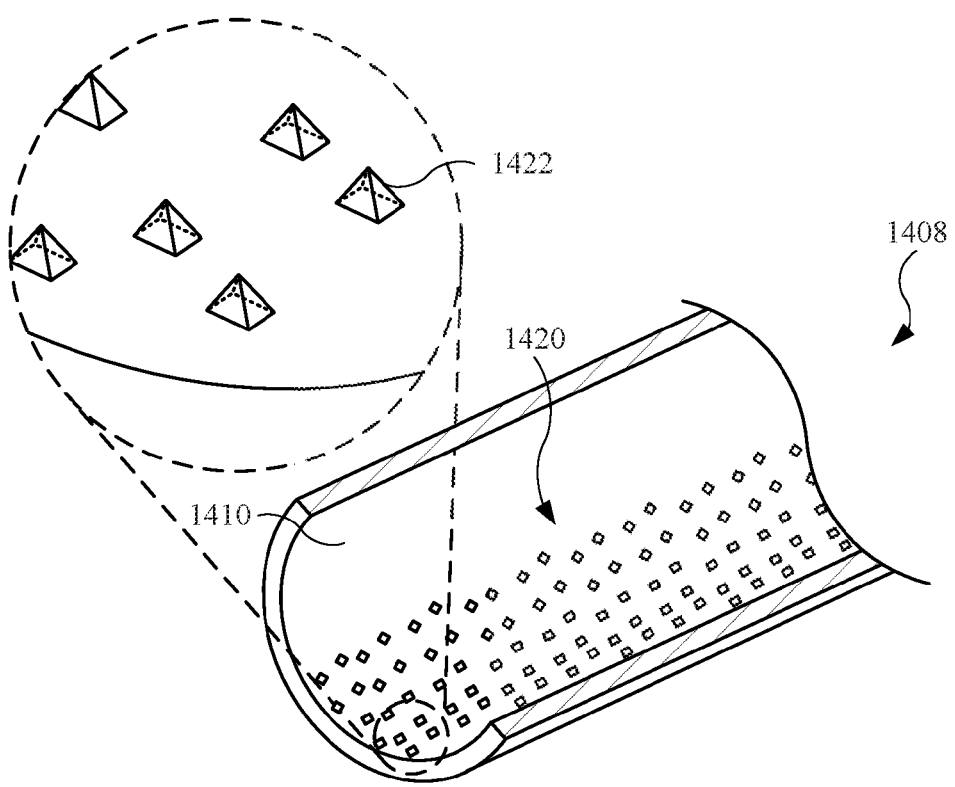
FIG. 22 illustrates a partial cross sectional view of an alternate embodiment of a port suitable for use in an electronic device, showing an internal surface of the port having several protrusions, in accordance with some described embodiments.

FIG. 22 illustrates a partial cross sectional view of an alternate embodiment of a port 1408 suitable for use in an electronic device, showing an internal surface 1410 of the port 1408 having protrusions 1420, in accordance with some described embodiments. The protrusions 1420 may be located longitudinally along the port 1408. As shown in the enlarged view, a protrusion 1422, representative of the protrusions 1420, may extend from a wall that defines the internal surface 1410. In order to vary adhesion forces between a liquid (not shown) and the internal surface 1410 in the port 1408, the internal surface 1410 may include protrusions 1420 in some locations, while other locations remain relatively smooth. In some instances, the adhesion force between the liquid and the internal surface 1410 along the protrusions 1420 is lower relative to the smooth locations of the internal surface 1410 that do not include the protrusions 1420. However, this may differ based on the liquid and the type of material that forms the port 1408. Also, a molding operation can be used to form the port 1408, in a manner similar to that described in FIG. 21. However, the mold cavity used to form the port 1408 may include smooth regions and indentations, with the indentations having a shape corresponding to the protrusions 1420. Although, the protrusions 1420 are shown in a single location of the internal surface 1410, the internal surface 1410 may include an additional location (or locations) having a protrusions pattern similar to that of the protrusions 1420.

Figure 23:
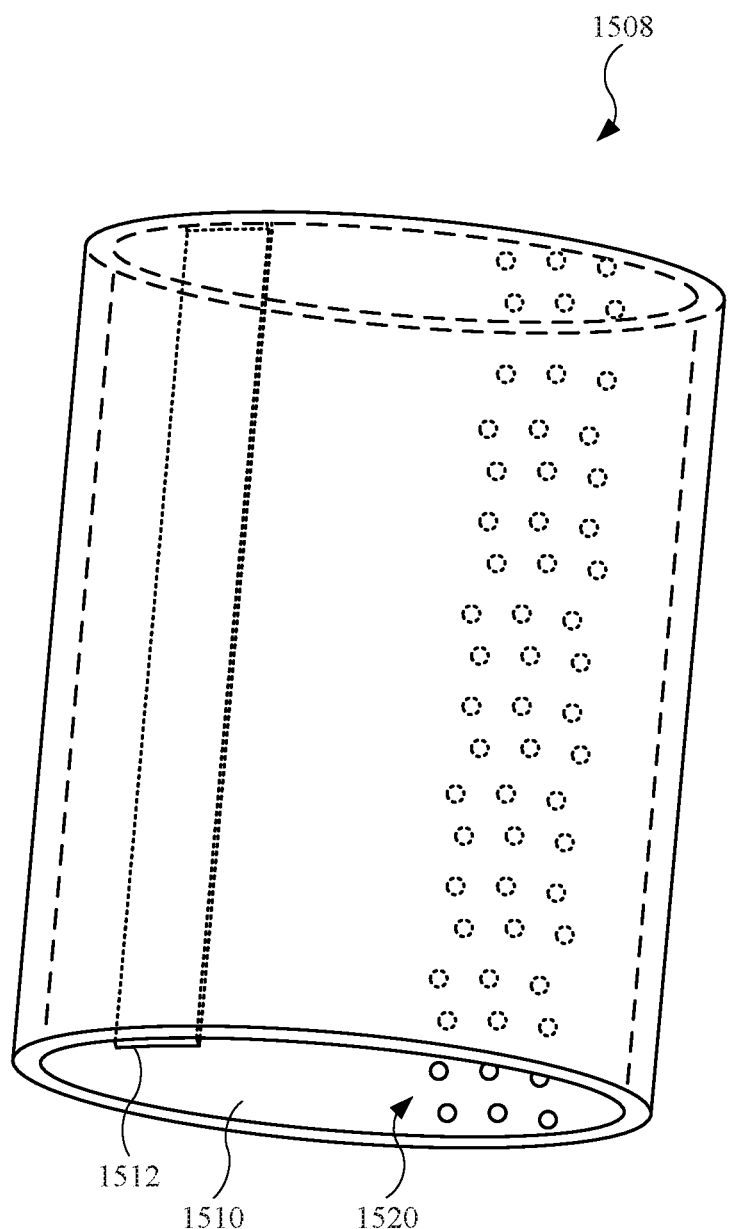
FIG. 23 illustrates an isometric view of an alternate embodiment of a port suitable for use in an electronic device, with an internal surface of the port having both a coating and a textured surface, in accordance with some described embodiments.

FIG. 23 illustrates an isometric view of an alternate embodiment of a port 1508 suitable for use in an electronic device, with an internal surface 1510 of the port 1508 having both a coating 1512 and a textured surface 1520, in accordance with some described embodiments. The coating 1512 may include either a hydrophilic coating or a hydrophobic coating. Also, the textured surface may take the form of indentations (similar to the indentations 1320 shown in FIG. 21) or protrusions (similar to the protrusions 1420 shown in FIG. 22). The various combinations can be selected to provide a desired surface energy gradient with a liquid in the port 1508, and may create a desired capillary pressure difference when a liquid (not shown) is in the port 1408.

Although not shown, different techniques and processes can be used to vary adhesion forces between a liquid and an internal surface of a port. For example, some locations (but not all) of an internal surface of the port may undergo a chemical etching operation to modify the surface along the chemically etched locations. Alternatively, or in combination, some locations (but not all) of an internal surface of the port may undergo a texturing operation, including sanding, polishing, or machining (as non-limiting examples) to modify the surface along the textured locations. By modifying an internal surface of a port through the aforementioned processes, the ports may vary the adhesion forces along the internal surface.

Figure 24:
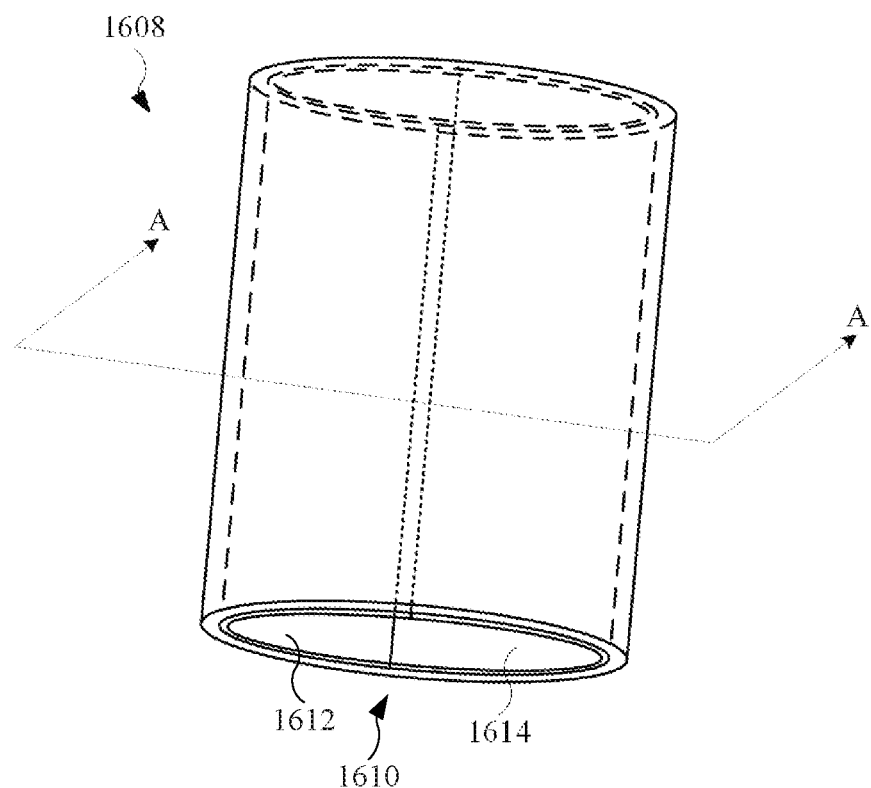
FIG. 24 illustrates an isometric view of an alternate embodiment of a port suitable for use in an electronic device, with an internal surface of the port covered by a first coating and a second coating.

FIG. 24 illustrates an isometric view of an alternate embodiment of a port 1608 suitable for use in an electronic device, with an internal surface 1610 of the port covered by a first coating 1612 and a second coating 1614. As shown, the first coating 1612 can combine with the second coating 1614 to fully cover the internal surface 1610. In this regard, adhesions forces between a liquid (not shown) and the internal surface 1610 depend upon the first coating 1612 and the second coating 1614, and not the material of the port 1608. In some embodiments, the first coating 1612 includes a hydrophobic coating and the second coating 1614 includes a hydrophilic coating. In this manner, adhesion forces between the liquid and the first coating 1612 may be less than the adhesion forces between the liquid and the second coating 1614. Accordingly, the first coating 1612 may repel the liquid to a greater extent than the material defining the internal surface 1610, and the second coating 1614 may attract the liquid to a greater extent than the material defining the internal surface 1610. Moreover, the difference in magnitude of adhesion forces between the liquid and the first coating 1612, and adhesion forces between the liquid and the second coating 1614 may increase, which may cause greater differences in surface tension and capillary pressure.

Figure 25:
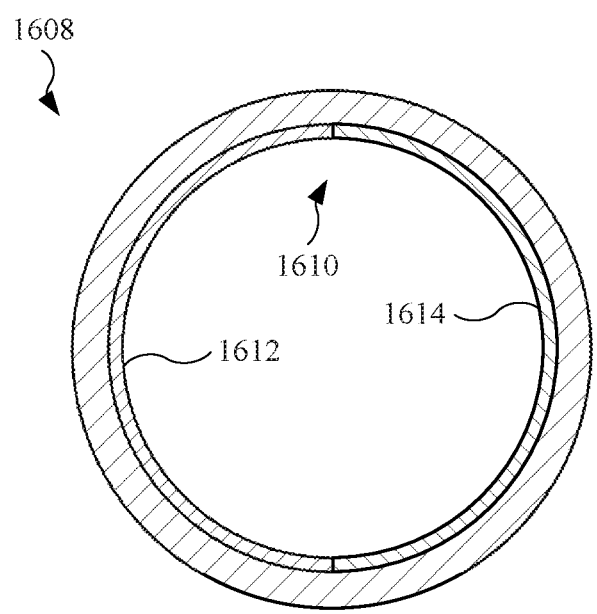
FIG. 25 illustrates a cross sectional view of the port shown in FIG. 24 taken along line A-A, showing the first coating and the second coating fully covering the internal surface of the port.

FIG. 25 illustrates a cross sectional view of the port 1608 shown in FIG. 24 taken along line A-A, showing the first coating 1612 and the second coating 1614 fully covering the internal surface 1610 of the port 1608. As shown, the first coating 1612 combines with the second coating 1614 to fully cover the internal surface 1610. In some embodiments, the first coating 1612 covers a majority of the internal surface 1610. In other embodiments, the second coating 1614 covers a majority of the internal surface 1610. In the embodiment shown in FIG. 25, the first coating 1612 and the second coating 1614 each cover half of the surface area of the internal surface 1610.

Figure 26:
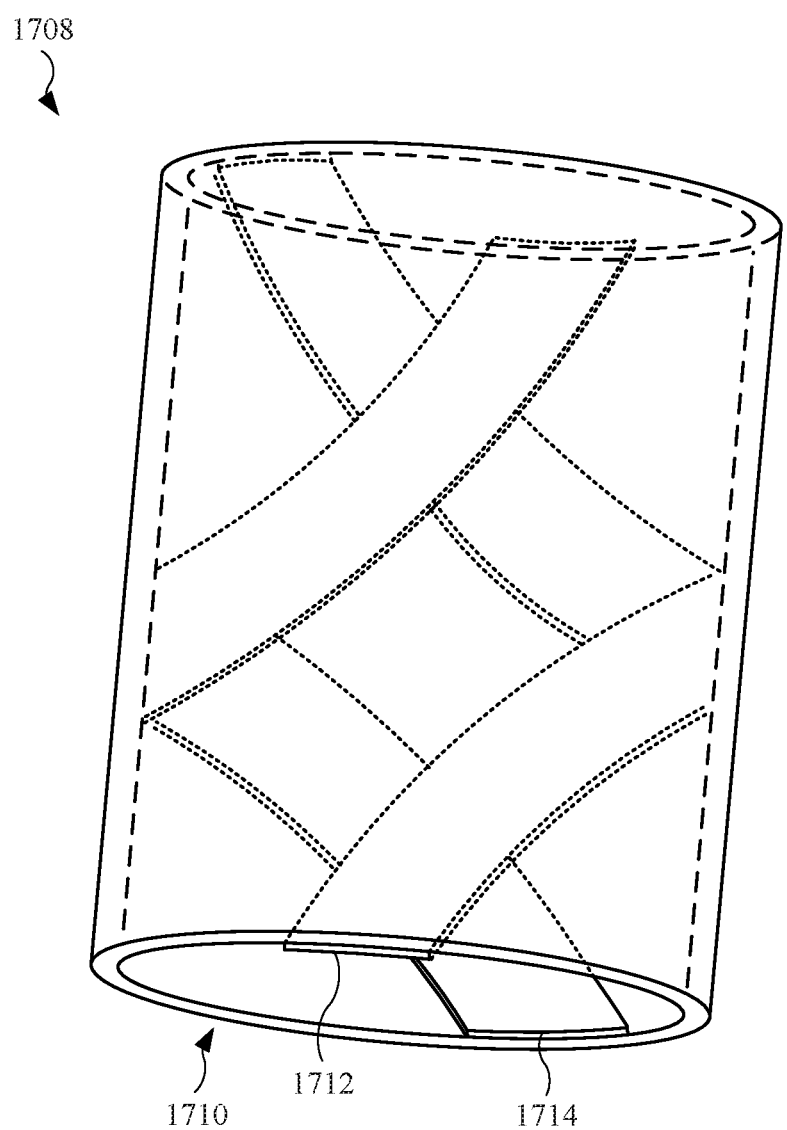
FIG. 26 illustrates an isometric view of an alternate embodiment of a port suitable for use in an electronic device, showing a first coating and a second coating covering an internal surface of the port along a spiral pattern, in accordance with some described embodiments.

FIG. 26 illustrates an isometric view of an alternate embodiment of a port 1708 suitable for use in an electronic device, showing a first coating 1712 and a second coating 1714 covering an internal surface 1710 of the port 1708 along a spiral pattern, in accordance with some described embodiments. Based on the spiral configuration of first coating 1712 and the second coating 1714, the adhesion forces between a liquid (not shown) and the internal surface 1710 may vary longitudinally along the internal surface 1710. This may promote a surface tension gradient along various locations of the port 1708, which, in turn, promote a capillary pressure gradient along various locations of the port 1708. The first coating 1712 and the second coating 1714 may include a hydrophobic or hydrophilic coating, so as to create differences in adhesion force between the liquid, as compared to adhesion force between the liquid and the uncoated regions of the internal surface 1710. These differences in adhesion forces may cause a capillary pressure gradient that forces the liquid out of the port 1708.

Figure 27:
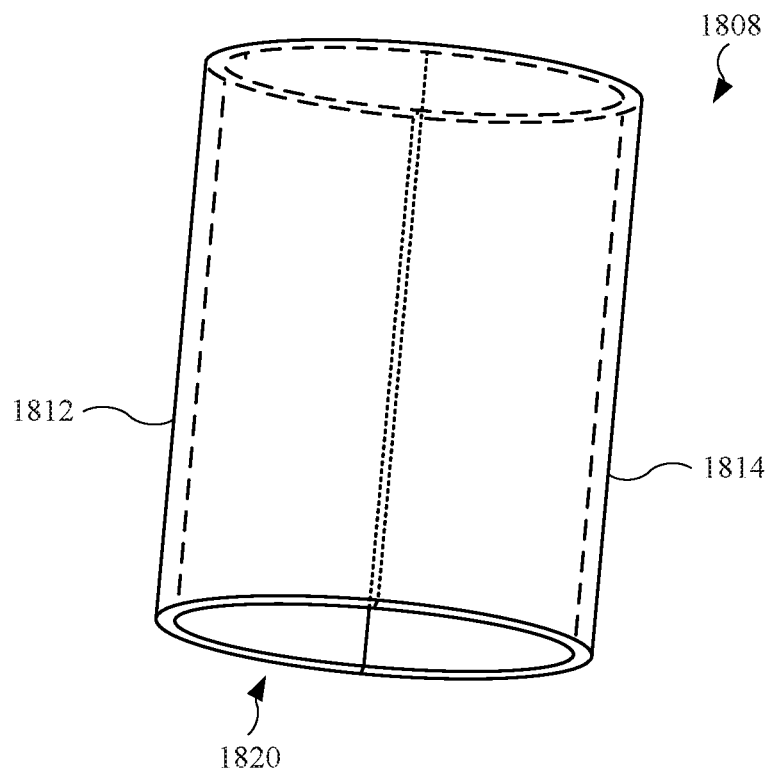
FIG. 27 illustrates an isometric view of an alternative embodiment of a port suitable for use in an electronic device, with the port formed from different materials, in accordance with some described embodiments.

FIG. 27 illustrates an isometric view of an alternative embodiment of a port 1808 suitable for use in an electronic device, with the port 1808 formed from different materials, in accordance with some described embodiments. As shown, the port 1808 may include a first part 1812 joined with a second part 1814 to define an opening 1820 of the port 1808. The first part 1812 can be formed from a first material, while the second part 1814 is formed from a second material. In some embodiments, the first material is different from the second material. For example, the first material may include a metal, such as steel (including stainless steel) or aluminum, as non-limiting examples. Further, the second material may include a polymeric material, such as plastic, as a non-limiting example. In this regard, when a liquid (not shown) is disposed in the port 1808, the interaction between the liquid and the first part 1812 may differ from the interaction between the liquid and the second part 1814. For example, the adhesion forces between the liquid and the first part 1812 may be greater than those between the liquid and the second part 1814. As a result, the liquid may separate from the second part 1814 prior to separation between the liquid and the first part 1812. This may cause an unbalanced capillary pressure within the port 1808 that allows ambient air to enter the port 1808 and further separate the liquid from the second part 1814, allowing gravitational forces to overcome other forces acting to retain the liquid. As a result, the port 1808, formed from different materials, may expel the liquid from the port 1808.

The first part 1812 may join with the second part 1814 by an adhesive (not shown). Alternatively, the first part 1812 may be placed in a mold cavity (not shown) that receives a moldable material that forms the second part 1814. In this regard, the second part 1814 can be molded to the first part 1812. Also, although not shown, the first part 1812 may include a recess (or recesses) that receive a portion of the moldable material that form the second part 1814 such that the first part 1812 is interlocked with the second part 1814.

Figure 28:
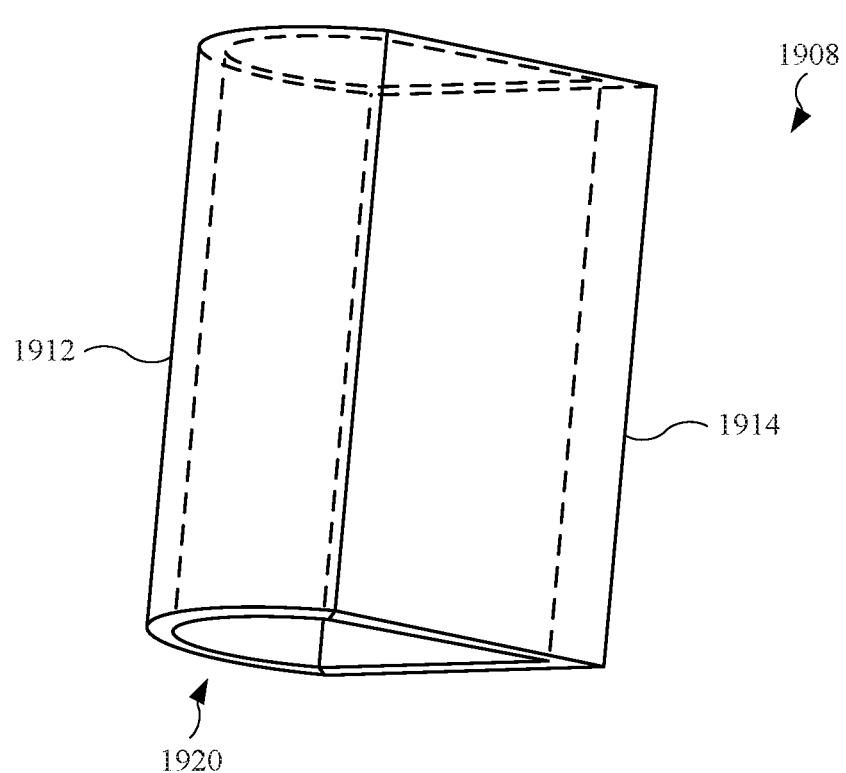
FIG. 28 illustrates an isometric view of an alternative embodiment of a port suitable for use in an electronic device, with the port formed from different materials that form an asymmetric opening, in accordance with some described embodiments.

FIG. 28 illustrates an isometric view of an alternative embodiment of a port 1908 suitable for use in an electronic device, with the port 1908 formed from different materials that form an asymmetric opening, in accordance with some described embodiments. As shown, the port 1908 may include a first part 1912 joined with a second part 1914 to define an opening 1920 in the port 1908. As shown in FIG. 28, the opening 1920 may include an asymmetric opening. The first part 1812 can be formed from a first material, which may include any material previously described for a "first material" the port 1808 (shown in FIG. 27). Also, the second part 1914 can be formed from a second material, which may include any material previously described for a "second material" the port 1808 (shown in FIG. 27). As a result, the difference in the radius of curvature between the first part 1912 and the second part 1914, as well as the difference in material makeup between the first part 1912 and the second part, may combine to cause a capillary pressure gradient within the port 1908 that allows ambient air to enter the port 1908 and ultimately separate the liquid from the second part 1914, allowing gravitational forces to overcome other forces acting to retain the liquid. As a result, the port 1908, being formed from different materials and having different radii of curvature, may expel the liquid from the port 1908.

Figure 29:
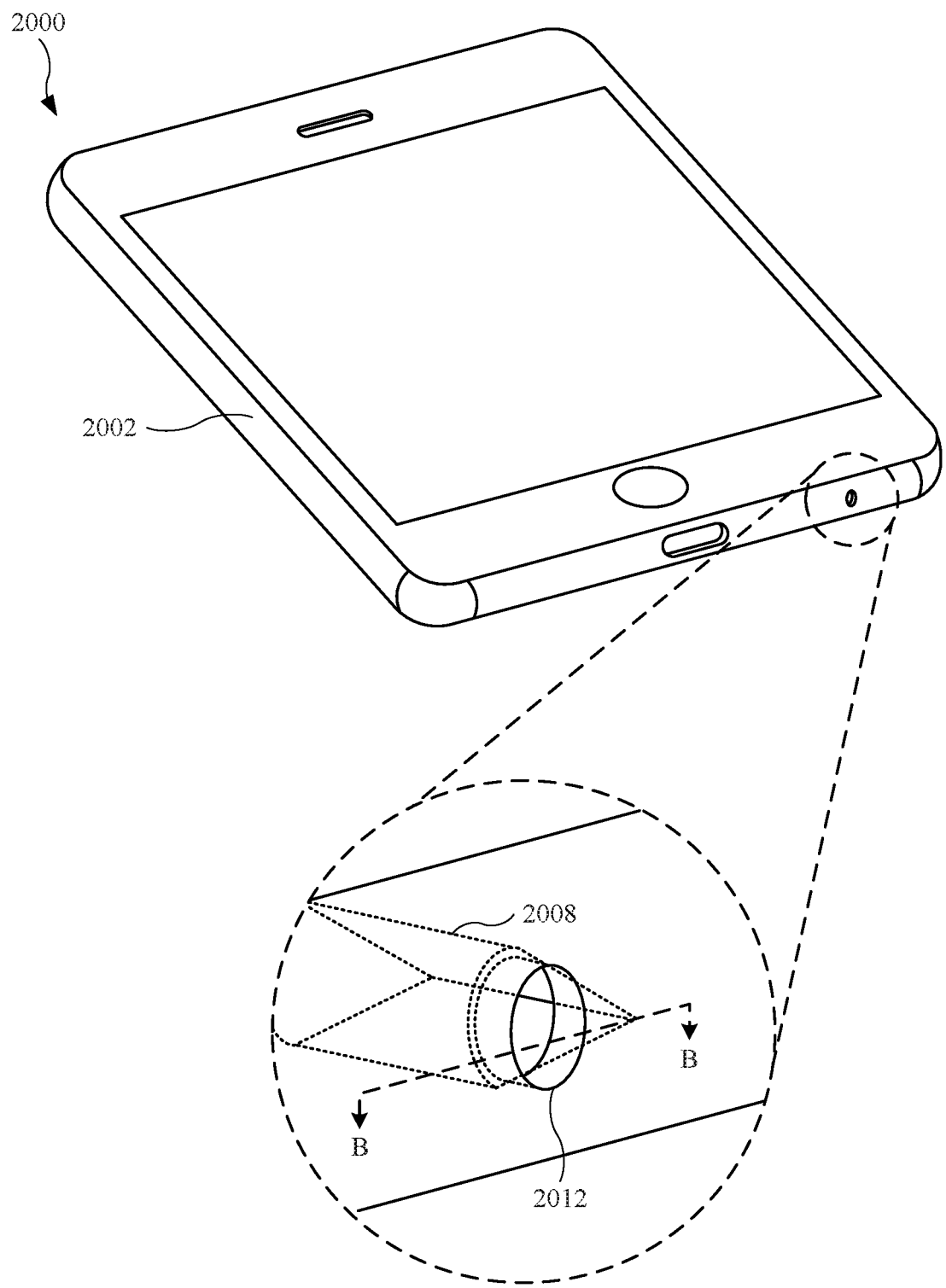
FIG. 29 illustrates an isometric view of an alternate embodiment of an electronic device having an enclosure with an opening, further showing a port aligned with the opening, in accordance with some described embodiments.

FIG. 29 illustrates an isometric view of an alternate embodiment of an electronic device 2000 having an enclosure 2002 with an opening 2012, further showing a port 2008 aligned with the opening 2012, in accordance with some described embodiments. The port 2008 may include a similar asymmetric profile as that of the port 308 shown in FIG. 3. Accordingly, the port 2008 may be designed to expel liquid (not shown) disposed in the port 2008. Other asymmetric or non-circular designs are possible. However, the opening 2012 may include a symmetrical design, such as a circular design. In this regard, the electronic device 2000 may include a port 2008 having an asymmetric profile in order to remove liquid from the port 2008, while also having an opening 2012 with an aesthetic, symmetric design that covers, or at least partially covers, the port 2008.

Figure 30:
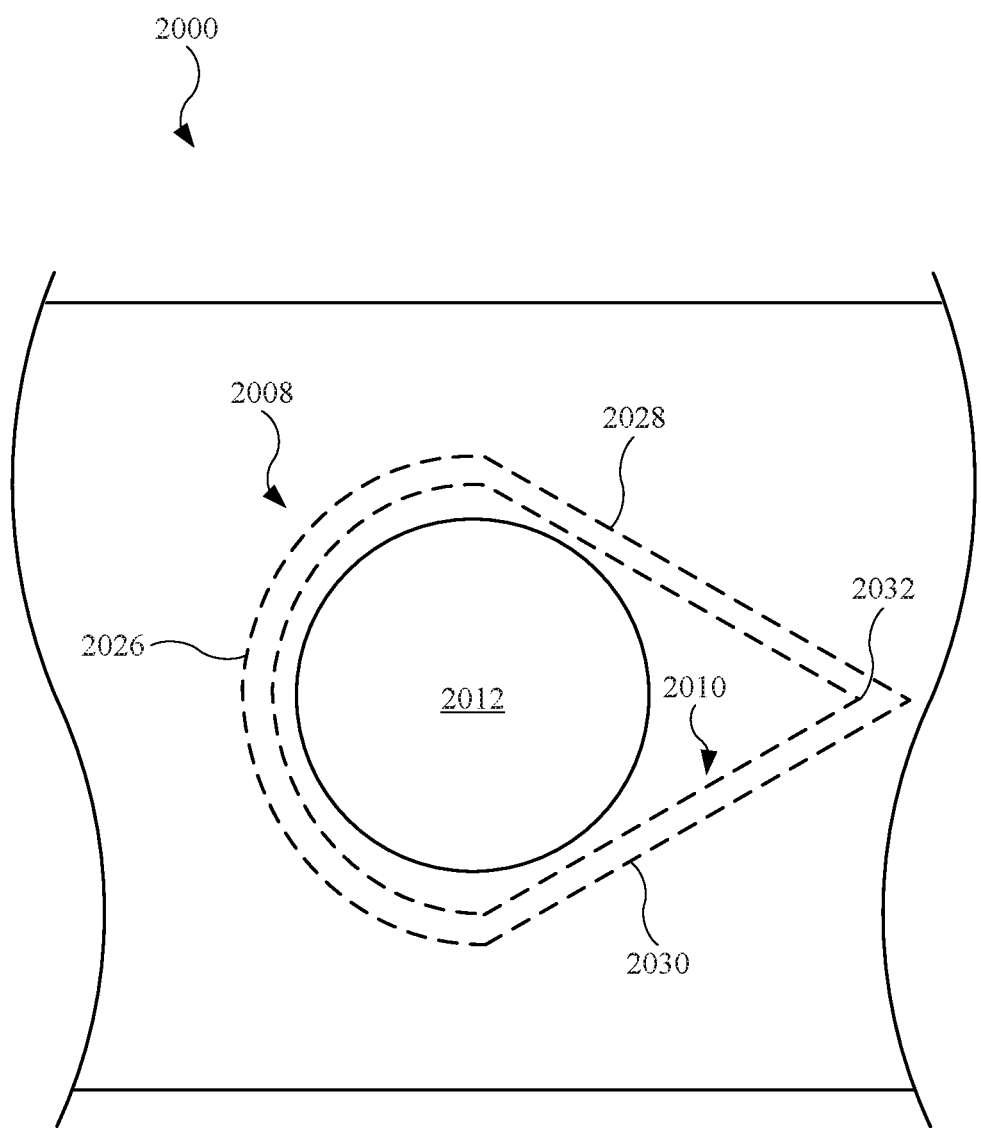
FIG. 30 illustrates a side view of the electronic device, showing the opening covering the port.

FIG. 30 illustrates a side view of the electronic device 2000, showing the opening 2012 covering the port 2008. As shown, the port 2008 may include a first wall 2026 having semi-circular, or substantially curved, design that connects to a second wall 2028 and a third wall 2030, both having substantially linear designs. Also, the second wall 2028 and the third wall 2030 may form an edge 2032 (between the second wall 2028 and the third wall 2030), similar to the edge 332 shown in FIG. 3. In this regard, the port 2008 may form a capillary pressure gradient with a liquid (not shown) in contact with an internal surface 2010 of the port 2008, based in part upon the difference in curvature between the first wall 2026 and a location along the edge 2032 (or portions of the second wall 2028 and the third wall 2030 located near the edge 2032). This will be further discussed below.

Figure 31:
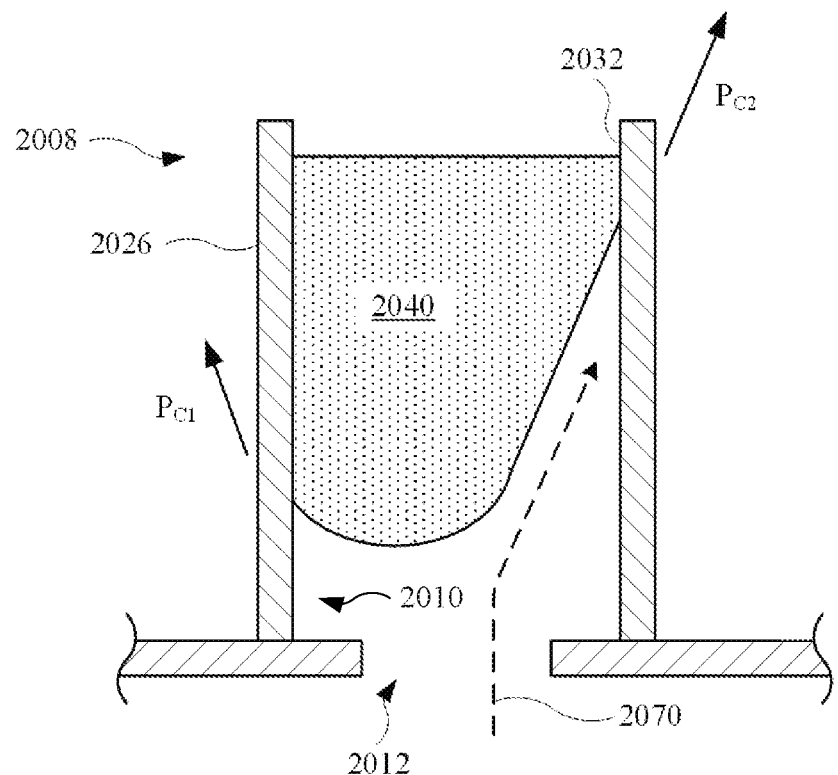
FIG. 31 illustrates a cross sectional view of the port shown in FIG. 29, taken along line B-B, further showing a liquid lodged in the port.

FIG. 31 illustrates a cross sectional view of the port 2008 shown in FIG. 29, taken along line B-B, further showing a liquid 2040 lodged in the port 2008. With the port 2008 having a design similar to that of the port 308 (shown in FIG. 3), the port 2008 may create a capillary pressure gradient with the liquid 2040 that causes capillary pressure differences within the port 2008. For example, a first capillary pressure, $P_{C1}$, within the port 2008 along the first wall 2026 and a second capillary pressure, $P_{C2}$, within the port 2008 along the edge 2032 (and some surrounding areas). As shown, the second capillary pressure, $P_{C2}$, is greater than the first capillary pressure, $P_{C1}$. As a result of the uneven capillary pressures, ambient air 2070 (or air external with respect to the port 2008) enters the opening 2012 and the port 2008 and extends through the port 2008 along a location corresponding to the edge 2032, thereby forcing the liquid 2040 away from the edge 2032. As an additional volume of the ambient air 2070 continues to enter the port 2008, the ambient air 2070 drives the liquid 2040 away from the edge 2032 and in a direction toward the first wall 2026.

Figure 32:
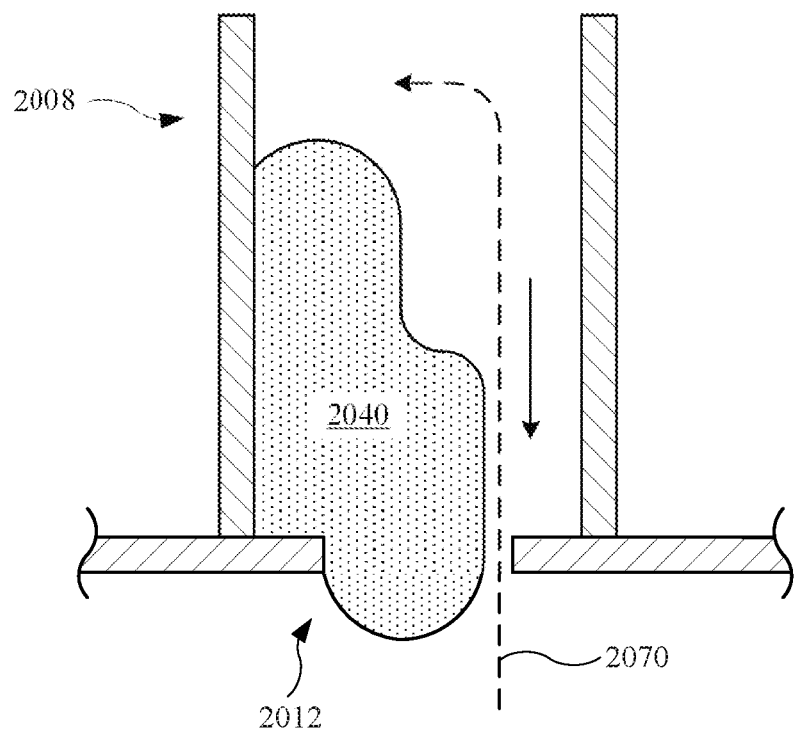
FIG. 32 illustrates a cross sectional view of the port shown in FIG. 31, further showing the liquid beginning to exit the port and the opening.

FIG. 32 illustrates a cross sectional view of the port 2008 shown in FIG. 31, further showing the liquid 2040 beginning to exit the port 2008 and the opening 2012. As the ambient air 2070 continues to exert pressure on the liquid 2040, the liquid 2040 is forced toward the first wall 2026, causing the liquid 2040 to exit the port 2008 and the opening 2012.

Figure 33:
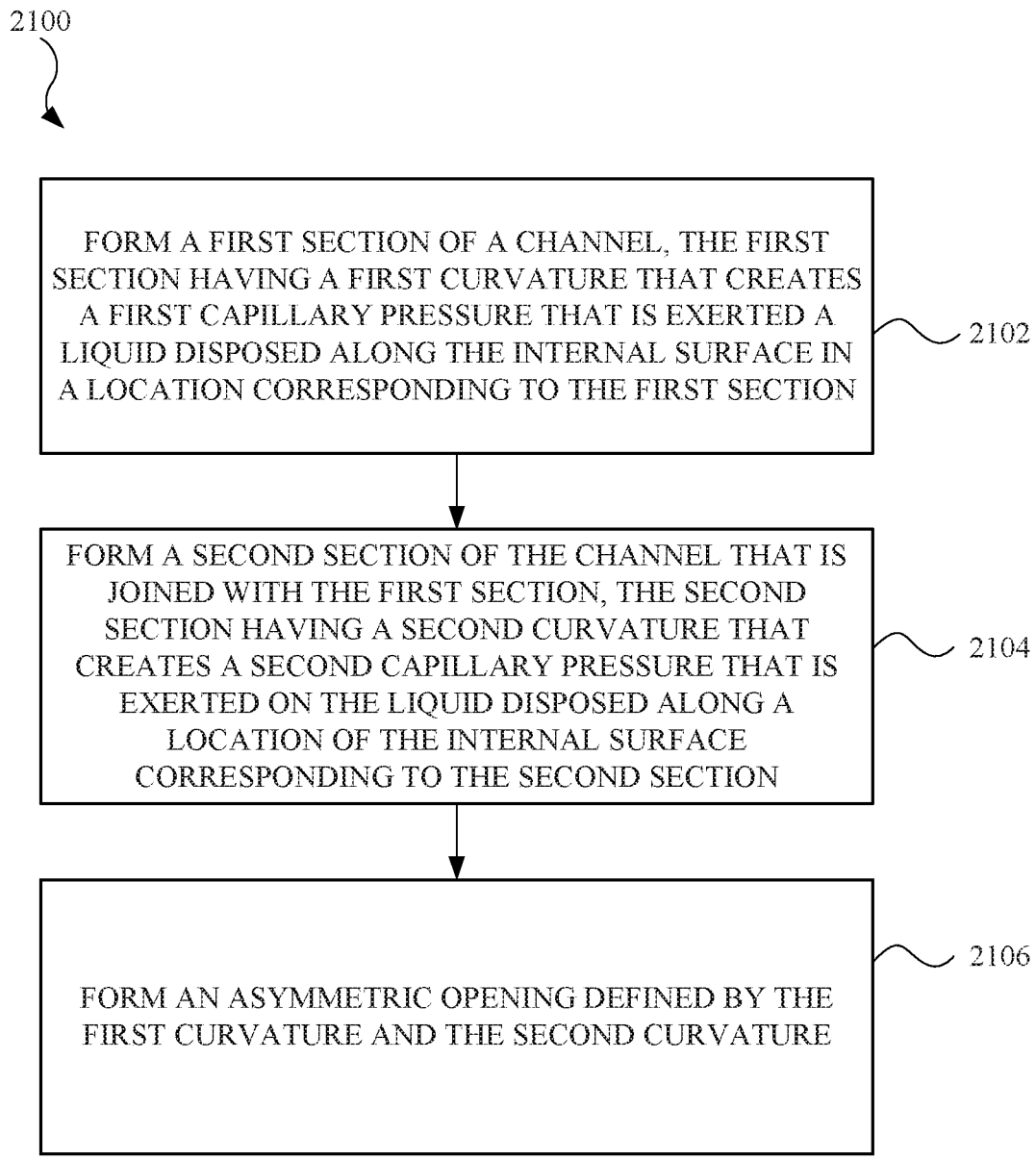
FIG. 33 illustrates a flowchart showing a method for forming a port suitable for use in an electronic device, in accordance with some described embodiments.

FIG. 33 illustrates a flowchart 2100 showing a method for forming a port suitable for use in an electronic device, in accordance with some described embodiments. The port may be designed to expel or eject a liquid. In step 2102, a first section of a channel is formed. The first section may include a first curvature that is designed to create a first capillary pressure that is exerted on a liquid along the internal surface in a location corresponding to the first section. In some instances, the first section includes a rounded wall, including a semi-circular wall. Also, the material that forms the channel (which may include a plastic or a moldable polymer, as non-limiting examples) may at least partially define a first surface energy of the internal surface. Also, a coating formed from a hydrophobic or hydrophilic material may at least partially define a second surface energy. For example, a hydrophobic coating may create a reduced surface energy as compared to an uncoated portion of internal surface. Alternatively, chemical etching or roughening the internal surface, or by providing indentations or protrusions to the internal surface, may at least partially define a surface energy gradient.

In step 2104, a second section is formed. The second section may be joined with the first section. The second section may include a second curvature that is designed to create a second capillary pressure that is exerted on the liquid along a location of the internal surface corresponding to the second section. In some embodiments, the first and second sections of the channel are formed by a molding operation that used a moldable material. The molding operation may include injection molding or compression molding, as non-limiting examples. Further, the curvature of the first and second sections may differ. For example, the first curvature of the first section may be generally round and having a relatively low curvature, while the second curvature of the second section may include an edge defined by a joint between two linear, or at least substantially linear, walls. In this regard, the second curvature, formed in part by the edge, may include a relatively higher curvature, as compared to the first curvature. However, it should be noted that the first section and the second section may take on other shapes. For example, the first section and the second section may include one or more walls that incorporate designs of the ports shown in FIG. 15-18. Alternatively, or in combination, the first section and the second section may include different materials, similar to the ports shown in FIGS. 27 and 28.

In step 2106, an asymmetric opening is formed. The first section and the second section may define the opening. When the liquid is positioned in the port between the first section and the second section (and engaged with the internal surface), the asymmetric opening may cause a capillary pressure gradient. For example, the second section (having the higher curvature) may induce a greater capillary pressure as compared to the first capillary pressure along the first section. The uneven capillary pressure may draw ambient air into the port, which forces the liquid away from the edge and out of the asymmetric opening of the port.

Also, in some embodiments, the internal surface is coated with a hydrophobic material and/or a hydrophilic material. The coating(s) may partially or fully cover the internal surface. Also, the coatings may be applied linearly along portions of the internal surface, or may be applied according to non-linear designs, such as a spiral design.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   an enclosure defining an internal volume, the enclosure having a through hole; and
   a port at least partially aligned with the through hole and extending at least to the internal volume, the port comprising an internal surface, the internal surface comprising:
      a first portion having a first curvature that creates a first capillary pressure that is exerted by a liquid in contact with the first portion, and
      a second portion having a second curvature that is different than the first curvature, the second curvature creating a second capillary pressure that is exerted by the liquid in contact with the second portion, the second capillary pressure different from the first capillary pressure.

2. The electronic device of claim 1, wherein a difference in capillary pressure between the first capillary pressure and the second capillary pressure defines a capillary pressure gradient that causes the liquid contained within the port to exit from the port.

3. The electronic device of claim 2, wherein the capillary pressure gradient is at least partially defined by an asymmetric cross section that includes the first portion and the second portion.

4. The electronic device of claim 3, wherein:
   the first curvature includes a rounded wall, and
   the second curvature includes a first linear wall and a second linear wall joined with the first linear wall to define an edge.

5. The electronic device of claim 4, wherein the second curvature is greater than the first curvature.

6. The electronic device of claim 1, further comprising:
   a first section defined by the first portion; and
   a second section defined by the second portion, wherein the first section and the second section define a through hole that includes an asymmetric cross section.

7. The electronic device of claim 1, wherein at least the second portion includes a hydrophobic coating.

8. A port suitable for use in an electronic device, the port comprising:
   a channel that defines an internal surface, the channel comprising:
      a first section having a first curvature that creates a first capillary pressure when a liquid is disposed along the internal surface in a location corresponding to the first section, and a second section joined with the first section, the second section having a second curvature that creates a second capillary pressure when the liquid is disposed along a location of the internal surface corresponding to the second section, wherein the second curvature is different from the first curvature, and an asymmetric opening defined by the first curvature and the second curvature, wherein the first capillary pressure is different from the second capillary pressure based upon the asymmetric opening.

9. The port of claim 8, the second curvature is greater than the first curvature, and wherein when the liquid is positioned within the channel, the second capillary pressure causes ambient air to enter the asymmetric opening and force the liquid away from the second section and toward the first section, thereby causing the liquid to exit the asymmetric opening.

10. The port of claim 8, wherein the channel comprises a through hole having a first opening and a second opening opposite the first opening, the first opening and the second opening defined by the asymmetric opening.

11. The port of claim 8, wherein the channel includes an asymmetric cross section defined by the asymmetric opening.

12. The port of claim 8, further comprising a coating applied to the internal surface, wherein the internal surface comprises a first surface energy, and wherein the coating that defines a second surface energy that is less than the first surface energy.

13. The port of claim 8, wherein the first section comprises a rounded wall, and wherein the second section comprises a first linear wall and a second linear wall that is joined with the first linear wall at an edge.

14. The port of claim 13, wherein the rounded wall defines the first curvature, and wherein the edge at least partially defines the second curvature.

15. A method for forming a port suitable for use in an electronic device, the port having an internal surface, the method comprising:

forming a first section of a channel, the first section having a first curvature that creates a first capillary pressure when a liquid disposed along the internal surface in a location corresponding to the first section;

forming a second section of the channel that is joined with the first section, the second section having a second curvature that creates a second capillary pressure when the liquid disposed along a location of the internal surface corresponding to the second section, wherein the second curvature is different from the first curvature; and forming an asymmetric opening that is defined by the first curvature and the second curvature, wherein the first capillary pressure is different from the second capillary pressure based upon the asymmetric opening.

16. The method of claim 15, wherein when the liquid is positioned between the first section and the second section, the second capillary pressure causes ambient air to enter the asymmetric opening and force the liquid away from the second section and toward the first section, thereby causing the liquid to exit the asymmetric opening.

17. The method of claim 15, wherein:

forming the first section comprises forming a rounded wall, forming the second section comprises forming a first linear wall and forming a second linear wall joined with the first linear wall to form an edge, the rounded wall, the first linear wall, and the second linear wall define the asymmetrical opening, and the edge creates the second capillary pressure with the liquid.

18. The method of claim 15, wherein forming the first section and the second section of the channel comprises molding the first section and the second section using a moldable material.

19. The method of claim 18, wherein molding the second section comprises forming a textured pattern that includes either protrusions or indentations in the second section, wherein the textured pattern defines a surface energy different from a surface energy of the first section.

20. The method of claim 15, further comprising applying a coating to the second section, the coating defining a surface energy less than a surface energy of the first section.

* * * * *